(12) United States Patent
Jang et al.

(10) Patent No.: US 11,128,038 B2
(45) Date of Patent: Sep. 21, 2021

(54) ELECTRONIC DEVICE COMPRISING ANTENNA

(71) Applicant: Samsung Electronics Co., Ltd., Suwon-si (KR)

(72) Inventors: Kyi Hyun Jang, Seoul (KR); Kyung Kyun Kang, Suwon-si (KR); Ji Ho Kim, Anyang-si (KR); Gyu Bok Park, Suwon-si (KR); Kyung Moon Seol, Yongin-si (KR); Hyun Jeong Lee, Suwon-si (KR); So Young Lee, Gwacheon-si (KR); Chang Ho Lee, Suwon-si (KR); Chi Hyun Cho, Yongin-si (KR); Jae Bong Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 198 days.

(21) Appl. No.: 16/464,502

(22) PCT Filed: Nov. 2, 2017

(86) PCT No.: PCT/KR2017/012362
§ 371 (c)(1),
(2) Date: May 28, 2019

(87) PCT Pub. No.: WO2018/097505
PCT Pub. Date: May 31, 2018

(65) Prior Publication Data
US 2021/0111484 A1 Apr. 15, 2021

(30) Foreign Application Priority Data

Nov. 28, 2016 (KR) .................. 10-2016-0159643

(51) Int. Cl.
*H01Q 1/42* (2006.01)
*H01Q 1/24* (2006.01)
(Continued)

(52) U.S. Cl.
CPC ............. *H01Q 1/42* (2013.01); *H01Q 1/48* (2013.01); *H01Q 13/10* (2013.01); *H05K 7/1427* (2013.01)

(58) Field of Classification Search
CPC ........... H01Q 1/42; H01Q 1/48; H01Q 13/10; H01Q 1/24; H01Q 1/241; H01Q 1/243
See application file for complete search history.

(56) References Cited

U.S. PATENT DOCUMENTS

2009/0073059 A1  3/2009  Ikegaya
2015/0222009 A1*  8/2015  Asou ................. H01Q 7/00
                                                    343/702
(Continued)

FOREIGN PATENT DOCUMENTS

CN   104168730 A   11/2014
CN   104540341 A   4/2015
(Continued)

OTHER PUBLICATIONS

Extended European Search Report dated Oct. 24, 2019, issued in European Patent Application No. 17874293.8-1205.

*Primary Examiner* — Hoang V Nguyen
(74) *Attorney, Agent, or Firm* — Jefferson IP Law, LLP

(57) ABSTRACT

Disclosed is an electronic device. According to an embodiment, the electronic device includes a housing that covers at least a portion of a back surface of the electronic device, a plurality of slits being formed in parallel from one end to an opposite end and the at least a portion of the housing being formed of a conductive material, a feeder that is electrically connected with at least one point of the housing, and a
(Continued)

ground part that is electrically connected with at least one point of the housing. A part of the plurality of slits includes a section greater in width than another part of the plurality of slits. Moreover, various embodiment found through the disclosure are possible.

14 Claims, 21 Drawing Sheets

(51) Int. Cl.
    *H01Q 13/10*     (2006.01)
    *H01Q 1/48*     (2006.01)
    *H05K 7/14*     (2006.01)

(56) References Cited

U.S. PATENT DOCUMENTS

| | | |
|---|---|---|
| 2015/0241921 A1 | 8/2015 | Gu et al. |
| 2015/0303551 A1 | 10/2015 | Su et al. |
| 2016/0116948 A1 | 4/2016 | Ou et al. |
| 2016/0254678 A1 | 9/2016 | Standke et al. |
| 2016/0352007 A1* | 12/2016 | Gu .......................... H01Q 1/42 |
| 2017/0149118 A1 | 5/2017 | Wang et al. |
| 2017/0197344 A1 | 7/2017 | Gu et al. |
| 2017/0199546 A1 | 7/2017 | Gu et al. |
| 2017/0212553 A1 | 7/2017 | Ou et al. |
| 2017/0220079 A1 | 8/2017 | Ou et al. |

FOREIGN PATENT DOCUMENTS

| | | |
|---|---|---|
| CN | 104584324 A | 4/2015 |
| CN | 104640391 A | 5/2015 |
| CN | 105282998 A | 1/2016 |
| CN | 105428789 A | 3/2016 |
| CN | 105932396 A | 9/2016 |
| CN | 105932398 A | 9/2016 |
| JP | 2009-038507 A | 2/2009 |
| KR | 10-2014-0100384 A | 8/2014 |
| KR | 10-2015-0106701 A | 9/2015 |
| KR | 10-2016-0006910 A | 1/2016 |

\* cited by examiner ically connected or coupled with the wireless communication circuit. The plurality of slits may include a first slit that extends in the first direction and has a first width, which is smaller than or the same as 0.50 mm, in the second direction, and a second slit that extends parallel to the first slit and has a second width smaller than the first width in the second direction.

ELECTRONIC DEVICE COMPRISING ANTENNA

TECHNICAL FIELD

Embodiments of the disclosure relates to a technology for implementing an antenna including a slit.

BACKGROUND ART

A wireless communication technology makes it possible to transmit/receive various forms of information such as a text, an image, a video, voice, or the like. The wireless communication technology is being developed to transmit/receive more information faster. As the wireless communication technology develops, an electronic device such as a wireless communication-possible smartphone or tablet may provide a service using a communication function, such as digital multimedia broadcasting (DMB), global positioning system (GPS), wireless-fidelity (Wi-Fi), long-term evolution (LTE), near field communication (NFC), magnetic stripe transmission (MST), or the like. To provide such a service, the electronic device may include one or more antennas.

The antenna provided in the electronic device may be formed of a conductive material. To improve the design of the electronic device, nowadays, at least a portion of a back and side housing of the electronic device may be formed of metal. In this case, the housing may be used as an antenna radiator.

DISCLOSURE

Technical Problem

An electronic device may include a housing that forms the exterior of the electronic device. At least a portion of the housing may include a conductive material. A slit for radiation of an electrical signal may be formed in the housing. The slit formed in the housing may be filled with an insulating member. In this case, the insulating member may spoil the beauty of the electronic device. To reduce the visibility of the insulating member, a manufacturer of the electronic device may form a plurality of slits having a relatively small width in the housing by splitting one slit having a relatively large width. However, in the case where a plurality of slits are formed in the housing, portions of the housing, which are interposed between the plurality of slits, may make the performance of radiation of the antenna low.

Embodiments of the disclosure may provide a method capable of improving the performance of radiation of a housing in which there are formed a plurality of slits used as an antenna radiator.

Technical Solution

An electronic device according to an embodiment of the disclosure may include a housing that covers at least a portion of a back surface of the electronic device, a plurality of slits being formed in parallel from one end to an opposite end and the at least a portion of the housing being formed of a conductive material, a feeder that is electrically connected with at least one point of the housing, and a ground part that is electrically connected with at least one point of the housing. A part of the plurality of slits may include a section greater in width than another part of the plurality of slits.

Also, an electronic device according to an embodiment of the disclosure may include a body and a housing that is combined with the body and covers at least a portion of a back surface of the body and at least a portion of a side surface of the body. The housing may include a metal member that is exposed to the outside when combined with the body, a plurality of slits being formed in parallel from one end to an opposite end, and a nonconductive member that supports the metal member and is in contact with the body. A width of a part of the plurality of slits may be greater than a width of another part of the plurality of slits.

Also, an electronic device according to an embodiment of the disclosure may include a housing that covers at least a portion of a back surface of the electronic device, a plurality of slits being formed in parallel from one end of the housing to an opposite end of the housing, and the housing including an upper end portion positioned above the plurality of slits, a center portion positioned below the plurality of slits, a connection part connecting the upper end portion and the center portion, and a plurality of extensions extending toward the one end from the connection part in a state where the plurality of extensions are interposed between the plurality of slits, and a printed circuit board that is positioned under the housing and includes a feeder electrically connected with at least one point of the upper end portion and a ground part electrically connected with at least one point of the center portion of the housing. A width of a part of the plurality of slits may be greater than a width of another part of the plurality of slits.

Also, an electronic device according to an embodiment of the disclosure may include a housing that includes a first plate, a second plate facing away from the first plate, and a side member surrounding a space between the first plate and the second plate, a display that is exposed through at least a portion of the first plate, a wireless communication circuit that is positioned within the housing, and a processor that is positioned within the housing and is electrically connected with the display and the communication circuit. The second plate may have a rectangular shape that includes a first side extending in a first direction and having a first length, a second side extending in a second direction perpendicular to the first direction and having a second length greater than the first length, a third side extending parallel to the first side and having the first length, and a fourth side extending parallel to the second side and having the second length. The second plate may have a metallic portion and a plurality of slits passing through the metallic portion and formed of a nonconductive member. The metallic portion may be electrically connected or coupled with the wireless communication circuit. The plurality of slits may include a first slit that extends in the first direction and has a first width, which is smaller than or the same as 0.50 mm, in the second direction, and a second slit that extends parallel to the first slit and has a second width smaller than the first width in the second direction.

Also, an electronic device according to an embodiment of the disclosure may include a housing that includes a first plate, a second plate facing away from the first plate, and a side member surrounding a space between the first plate and the second plate, a display that is exposed through at least a portion of the first plate, a wireless communication circuit that is positioned within the housing, a conductive structure that is interposed between the first plate and the second plate and is electrically connected with the wireless communication circuit, an electrical insulating layer that is interposed between the conductive structure and the second plate, and a processor that is positioned with the housing and is electrically connected with the display and the communication circuit. The second plate may have a metallic portion and a plurality of slits passing through the metallic portion and formed of a nonconductive member. The plurality of slits may extend parallel to each other and has a width smaller than or the same as 0.50 mm. The conductive structure may at least partially overlap the metallic portion and at least one of the plurality of slits, when viewed from above the second plate.

Advantageous Effects

According to embodiments of the disclosure, the performance of radiation of an antenna may be improved by forming a width of a part of a plurality of slits to be greater than a width of another part.

According to embodiments of the disclosure, a resonant frequency of a housing may be adjusted by employing a switch electrically connected with portions of the housing, which are interposed between the plurality of slits.

According to embodiments of the disclosure, a resonant frequency of a housing may be adjusted by employing a switch that is electrically connected with a conductive member electrically coupled with the portions of the housing, which are interposed between the plurality of slits.

Besides, a variety of effects directly or indirectly understood through this disclosure may be provided.

MODE FOR INVENTION

Figure 1:
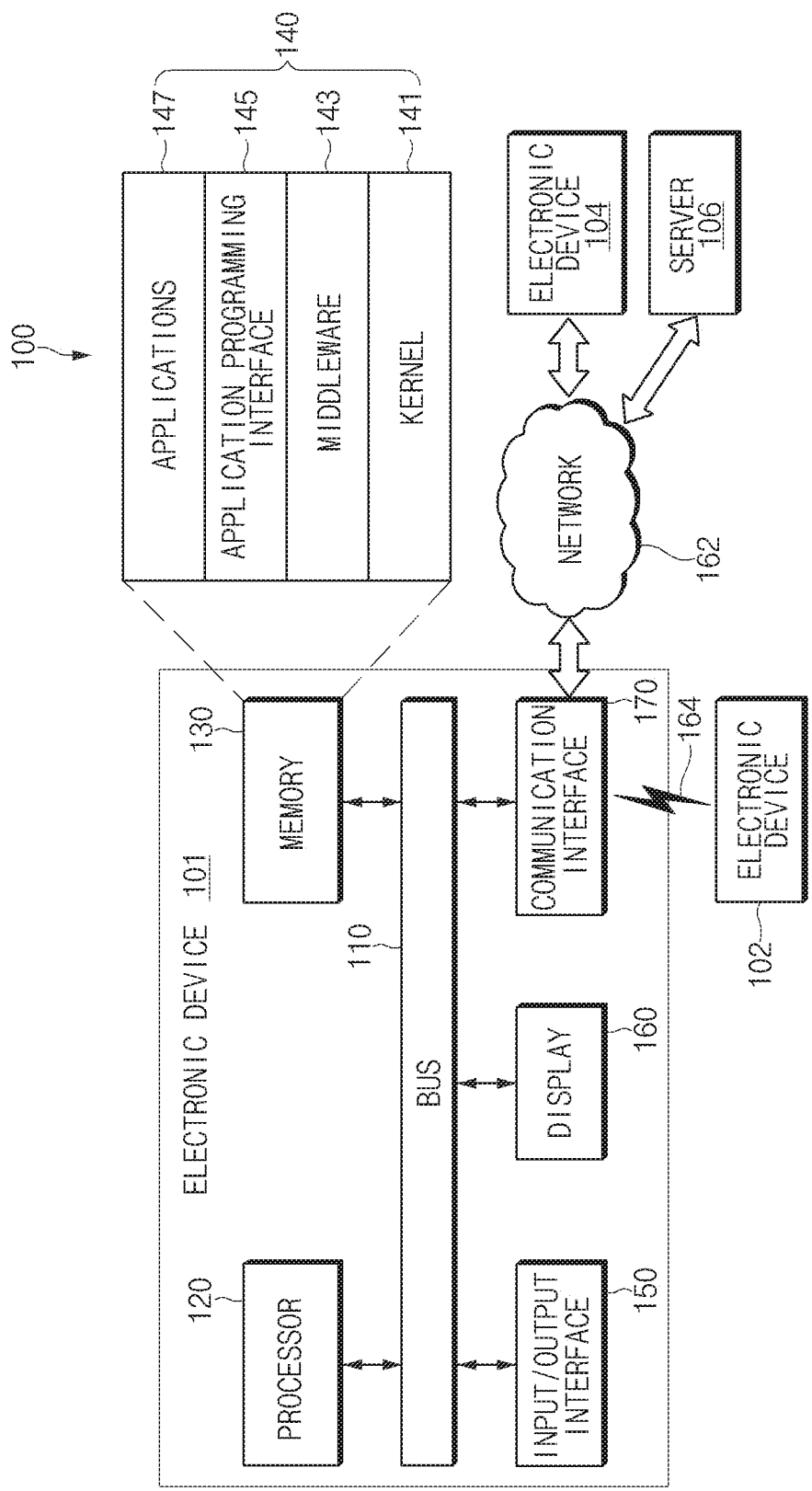
FIG. 1 illustrates an electronic device in a network environment according to various embodiments.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals. The terms of a singular form may include plural forms unless otherwise specified. In this disclosure, the expressions "A or B", "at least one of A or/and B", or "one or more of A or/and B", and the like may include any and all combinations of one or more of the associated listed items. The terms, such as "first", "second", and the like may be used to refer to various components regardless of the order and/or the priority and to distinguish the relevant components from other components, but do not limit the components. When an component (e.g., a first component) is referred to as being "(operatively or communicatively) coupled with/to" or "connected to" another component (e.g., a second component), the component may be directly coupled with/to or connected to the other component or an intervening component (e.g., a third component) may be present.

According to the situation, the expression "configured to" used in this disclosure may be used as, for example, the expression "suitable for", "having the capacity to", "adapted to", "made to", "capable of", or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit). According to various embodiments, the electronic device may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (e.g., Samsung HomeSync™ Apple TV™, or Google TV™), game consoles (e.g., Xbox™ or PlayStation™) electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, drones, automatic teller's machines (ATMs), points of sales (POSs) of stores, or internet of things (e.g., light bulbs, various sensors, sprinkler devices, fire alarms, thermostats, street lamps, toasters, exercise equipment, hot water tanks, heaters, boilers, and the like). According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be a flexible electronic device or a combination of two or more above-described devices. Furthermore, an electronic device according to an embodiment of this disclosure may not be limited to the above-described electronic devices. In this disclosure, the term "user" may refer to a person who uses an electronic device or may refer to a device (e.g., an artificial intelligence electronic device) that uses the electronic device.

FIG. 1 illustrates an electronic device 101 in a network environment 100 according to various embodiments. Referring to FIG. 1, the electronic device 101 may include a bus 110, a processor 120, a memory 130, an input/output interface 150, a display 160, and a communication interface 170. According to an embodiment, the electronic device 101 may not include at least one of the above-described components or may further include other component(s). The bus 110 may interconnect the above-described components 110 to 170 and may include a circuit for conveying communications (e.g., a control message and/or data) among the above-described components. The processor 120 may include one or more of a central processing unit (CPU), an application processor (AP), or a communication processor (CP). For example, the processor 120 may perform an arithmetic operation or data processing associated with control and/or communication of at least other components of the electronic device 101.

The memory 130 may include a volatile and/or nonvolatile memory. For example, the memory 130 may store instructions or data associated with at least one other component(s) of the electronic device 101. According to an embodiment, the memory 130 may store software and/or a program 140. The program 140 may include, for example, a kernel 141, a middleware 143, an application programming interface (API) 145, and/or an application program (or "an application") 147. At least a part of the kernel 141, the middleware 143, or the API 145 may be referred to as an "operating system (OS)". For example, the kernel 141 may control or manage system resources (e.g., the bus 110, the processor 120, the memory 130, and the like) that are used to execute operations or functions of other programs (e.g., the middleware 143, the API 145, and the application program 147). Furthermore, the kernel 141 may provide an interface that allows the middleware 143, the API 145, or the application program 147 to access discrete components of the electronic device 101 so as to control or manage system resources.

The middleware 143 may perform, for example, a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (e.g., the bus 110, the processor 120, the memory 130, or the like) of the electronic device 101, to at least one of the application program 147 and may process the one or more task requests. The API 145 may be an interface through which the application program 147 controls a function provided by the kernel 141 or the middleware 143, and may include, for example, at least one interface or function (e.g., an instruction) for a file control, a window control, image processing, a character control, or the like. The input/output interface 150 may transmit an instruction or data input from a user or another external device, to other component(s) of the electronic device 101 or may output an instruction or data, received from other component(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, gesture, proximity, or hovering input using an electronic pen or a part of a user's body. For example, the communication interface 170 may establish communication between the electronic device 101 and an external device (e.g., the first electronic device 102, the second electronic device 104, or the server 106). For example, the communication interface 170 may be connected to the network 162 over wireless communication or wired communication to communicate with the external device (e.g., the second electronic device 104 or the server 106).

For example, the wireless communication may include cellular communication using at least one of long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like. The wireless communication may include at least one of wireless fidelity (Wi-Fi), Bluetooth, Bluetooth low energy (BLE), Zigbee, near field communication (NFC), magnetic stripe transmission (MST), radio frequency (RF), a body area network, or the like. According to an embodiment, the wireless communication may include GNSS. The GNSS may be one of, for example, a global positioning system (GPS), a global navigation satellite system (Glonass), a Beidou navigation satellite system (hereinafter referred to as "Beidou"), or an European global satellite-based navigation system (hereinafter referred to as "Galileo"). Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), power line communication, a plain old telephone service (POTS), or the like. The network 162 may include at least one of telecommunications networks, for example, a computer network (e.g., LAN or WAN), an Internet, or a telephone network.

Each of the first and second external electronic devices 102 and 104 may be a device of which the type is different from or the same as that of the electronic device 101. According to various embodiments, all or a portion of operations that the electronic device 101 will perform may be executed by another or plural electronic devices (e.g., the electronic device 102 or 104 or the server 106). According to an embodiment, in the case where the electronic device 101 executes any function or service automatically or in response to a request, the electronic device 101 may not perform the function or the service internally, but, alternatively additionally, it may request at least a portion of a function associated with the electronic device 101 at other electronic device (e.g., the electronic device 102 or 104 or the server 106). The other electronic device (e.g., the electronic device 102 or 104 or the server 106) may execute the requested function or additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figure 2:
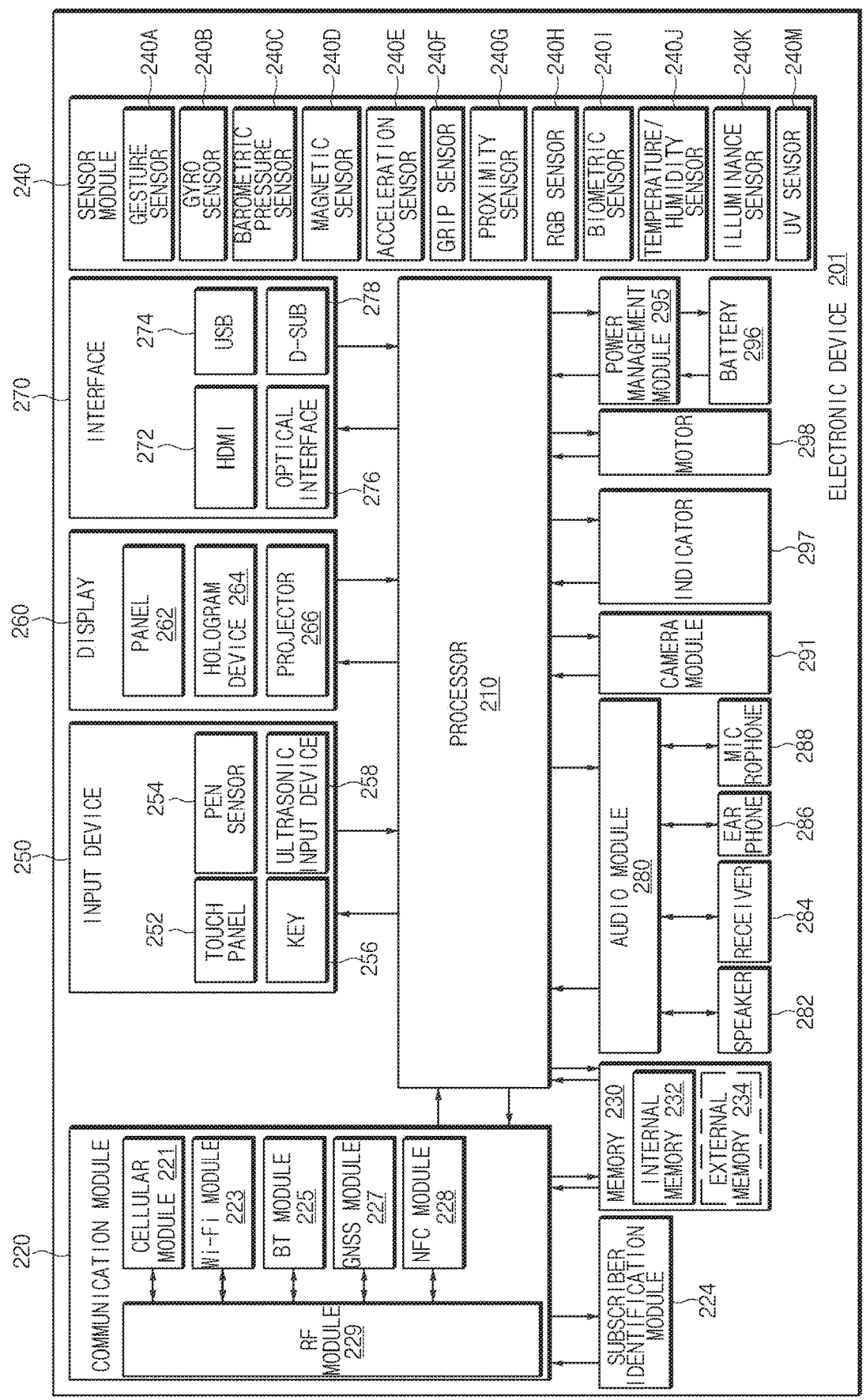
FIG. 2 illustrates a block diagram of an electronic device according to various embodiments.

FIG. 2 illustrates a block diagram of an electronic device 201, according to various embodiments. An electronic device 201 may include, for example, all or a part of the electronic device 101 illustrated in FIG. 1. The electronic device 201 may include one or more processors (e.g., an application processor (AP)) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. The processor 210 may drive, for example, an operating system (OS) or an application to control a plurality of hardware or software components connected to the processor 210 and may process and compute a variety of data. For example, the processor 210 may be implemented with a System on Chip (SoC). According to an embodiment, the processor 210 may further include a graphic processing unit (GPU) and/or an image signal processor. The processor 210 may include at least a part (e.g., a cellular module 221) of components illustrated in FIG. 2. The processor 210 may load a command or data, which is received from at least one of other components (e.g., a nonvolatile memory), into a volatile memory and process the loaded instruction or data. The processor 210 may store result data in the nonvolatile memory.

The communication module 220 may be configured the same as or similar to the communication interface 170 of FIG. 1. The communication module 220 may include the cellular module 221, a Wi-Fi module 223, a Bluetooth (BT) module 225, a GNSS module 227, a near field communication (NFC) module 228, and a radio frequency (RF) module 229. The cellular module 221 may provide, for example, voice communication, video communication, a character service, an Internet service, or the like over a communication network. According to an embodiment, the cellular module 221 may perform discrimination and authentication of the electronic device 201 within a communication network by using the subscriber identification module (e.g., a SIM card) 224. According to an embodiment, the cellular module 221 may perform at least a portion of functions that the processor 210 provides. According to an embodiment, the cellular module 221 may include a communication processor (CP). According to an embodiment, at least a part (e.g., two or more) of the cellular module 221, the Wi-Fi module 223, the BT module 225, the GNSS module 227, or the NFC module 228 may be included within one Integrated Circuit (IC) or an IC package. For example, the RF module 229 may transmit and receive a communication signal (e.g., an RF signal). For example, the RF module 229 may include a transceiver, a power amplifier module (PAM), a frequency filter, a low noise amplifier (LNA), an antenna, or the like. According to another embodiment, at least one of the cellular module 221, the Wi-Fi module 223, the BT module 225, the GNSS module 227, or the NFC module 228 may transmit and receive an RF signal through a separate RF module. The subscriber identification module 224 may include, for example, a card and/or embedded SIM that includes a subscriber identification module and may include unique identify information (e.g., integrated circuit card identifier (ICCID)) or subscriber information (e.g., international mobile subscriber identity (IMSI)).

The memory 230 (e.g., the memory 130) may include an internal memory 232 or an external memory 234. For example, the internal memory 232 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD). The external memory 234 may include a flash drive such as compact flash (CF), secure digital (SD), micro secure digital (Micro-SD), mini secure digital (Mini-SD), extreme digital (xD), a multimedia card (MMC), a memory stick, or the like. The external memory 234 may be operatively and/or physically connected to the electronic device 201 through various interfaces.

The sensor module 240 may measure, for example, a physical quantity or may detect an operation state of the electronic device 201. The sensor module 240 may convert the measured or detected information to an electric signal. For example, the sensor module 240 may include at least one of a gesture sensor 240A, a gyro sensor 240B, a barometric pressure sensor 240C, a magnetic sensor 240D, an acceleration sensor 240E, a grip sensor 240F, the proximity sensor 240G, a color sensor 240H (e.g., red, green, blue (RGB) sensor), a biometric sensor 240I, a temperature/humidity sensor 240J, an illuminance sensor 240K, or an UV sensor 240M. Although not illustrated, additionally or alternatively, the sensor module 240 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one or more sensors included therein. According to an embodiment, the electronic device 201 may further include a processor that is a part of the processor 210 or independent of the processor 210 and is configured to control the sensor module 240. The processor may control the sensor module 240 while the processor 210 remains at a sleep state.

The input device 250 may include, for example, a touch panel 252, a (digital) pen sensor 254, a key 256, or an ultrasonic input unit 258. For example, the touch panel 252 may use at least one of capacitive, resistive, infrared and ultrasonic detecting methods. Also, the touch panel 252 may further include a control circuit. The touch panel 252 may further include a tactile layer to provide a tactile reaction to a user. The (digital) pen sensor 254 may be, for example, a part of a touch panel or may include an additional sheet for recognition. The key 256 may include, for example, a physical button, an optical key, or a keypad. The ultrasonic input device 258 may detect (or sense) an ultrasonic signal, which is generated from an input device, through a microphone (e.g., a microphone 288) and may check data corresponding to the detected ultrasonic signal.

The display 260 (e.g., the display 160) may include a panel 262, a hologram device 264, a projector 266, and/or a control circuit for controlling the panel 262, the hologram device 264, or the projector 266. The panel 262 may be implemented, for example, to be flexible, transparent or wearable. The panel 262 and the touch panel 252 may be integrated into a single module. According to an embodiment, the panel 262 may include a pressure sensor (or force sensor) that measures the intensity of touch pressure by a user. The pressure sensor may be implemented integrally with the touch panel 252, or may be implemented as at least one sensor separately from the touch panel 252. The hologram device 264 may display a stereoscopic image in a space using a light interference phenomenon. The projector 266 may project light onto a screen so as to display an image. For example, the screen may be arranged in the inside or the outside of the electronic device 201. The interface 270 may include, for example, a high-definition multimedia interface (HDMI) 272, a universal serial bus (USB) 274, an optical interface 276, or a D-subminiature (D-sub) 278. The interface 270 may be included, for example, in the communication interface 170 illustrated in FIG. 1. Additionally or alternatively, the interface 270 may include, for example, a mobile high definition link (MHL) interface, a SD card/multi-media card (MMC) interface, or an infrared data association (IrDA) standard interface.

The audio module 280 may convert a sound and an electric signal in dual directions. At least a component of the audio module 280 may be included, for example, in the input/output interface 150 illustrated in FIG. 1. The audio module 280 may process, for example, sound information that is input or output through a speaker 282, a receiver 284, an earphone 286, or the microphone 288. For example, the camera module 291 may shoot a still image or a video. According to an embodiment, the camera module 291 may include at least one or more image sensors (e.g., a front sensor or a rear sensor), a lens, an image signal processor (ISP), or a flash (e.g., an LED or a xenon lamp). The power management module 295 may manage, for example, power of the electronic device 201. According to an embodiment, a power management integrated circuit (PMIC), a charger IC, or a battery or fuel gauge may be included in the power management module 295. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a part thereof (e.g., the processor 210), such as a booting state, a message state, a charging state, and the like. The motor 298 may convert an electrical signal into a mechanical vibration and may generate the following effects: vibration, haptic, and the like. The electronic device 201 may include a processing device (e.g., a GPU) for supporting a mobile TV. The processing device for supporting the mobile TV may process media data according to the standards of digital multimedia broadcasting (DMB), digital video broadcasting (DVB), MediaFLO™, or the like. Each of the above-mentioned components of the electronic device according to various embodiments of the disclosure may be configured with one or more components, and the names of the components may be changed according to the type of the electronic device. In various embodiments, some components of the electronic device (e.g., the electronic device 201) may be omitted or other additional components may be added. Furthermore, some of the components of the electronic device may be combined with each other so as to form one entity, so that the functions of the components may be performed in the same manner as before the combination.

Figure 3:
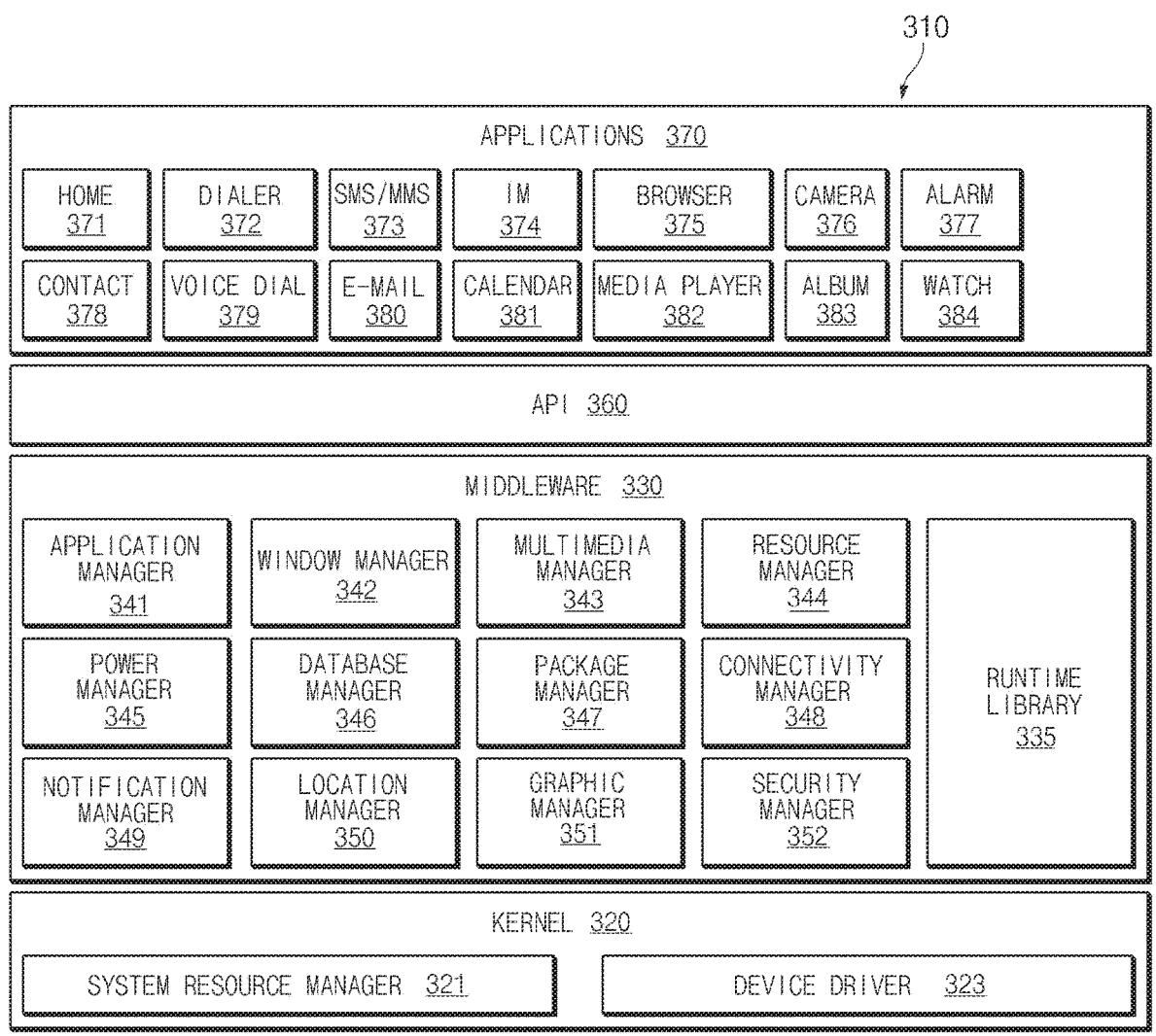
FIG. 3 illustrates a block diagram of a program module according to various embodiments.

FIG. 3 illustrates a block diagram of a program module, according to various embodiments. According to an embodiment, a program module 310 (e.g., the program 140) may include an operating system (OS) to control resources associated with an electronic device (e.g., the electronic device 101), and/or diverse applications (e.g., the application program 147) driven on the OS. The OS may be, for example, Android™, iOS™, Windows™, Symbian™, Tizen™, or Bada™. Referring to FIG. 3, the program module 310 may include a kernel 320 (e.g., the kernel 141), a middleware 330 (e.g., the middleware 143), an application programming interface (API) 360 (e.g., the API 145), and/or an application 370 (e.g., the application program 147). At least a portion of the program module 310 may be preloaded on an electronic device or may be downloadable from an external electronic device (e.g., the first electronic device 102, the second electronic device 104, the server 106, or the like).

The kernel 320 (e.g., the kernel 141) may include, for example, a system resource manager 321 or a device driver 323. The system resource manager 321 may control, allocate, or retrieve system resources. According to an embodiment, the system resource manager 321 may include a process managing unit, a memory managing unit, a file system managing unit, or the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide, for example, a function that the application 370 needs in common, or may provide diverse functions to the application 370 through the API 360 to allow the application 370 to efficiently use limited system resources of the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include, for example, a library module that is used by a compiler to add a new function through a programming language while the application 370 is being executed. The runtime library 335 may perform input/output management, memory management, or capacities about arithmetic functions. The application manager 341 may manage, for example, a life cycle of at least one application of the application 370. The window manager 342 may manage a graphic user interface (GUI) resource that is used in a screen. The multimedia manager 343 may identify a format necessary for playing diverse media files, and may perform encoding or decoding of media files by using a codec suitable for the format. The resource manager 344 may manage resources such as a memory space or source code of the application 370. The power manager 345 may manage a battery or power, and may provide power information for an operation of an electronic device. According to an embodiment, the power manager 345 may operate with a basic input/output system (BIOS). The database manager 346 may generate, search for, or modify database that is to be used in the application 370. The package manager 347 may install or update an application that is distributed in the form of package file.

The connectivity manager 348 may manage, for example, wireless connection. The notification manager 349 may provide an event, for example, arrival message, appointment, or proximity notification to a user. For example, the location manager 350 may manage location information about an electronic device. The graphic manager 351 may manage a graphic effect that is provided to a user, or manage a user interface relevant thereto. The security manager 352 may provide, for example, system security or user authentication. According to an embodiment, the middleware 330 may include a telephony manager for managing a voice or video call function of the electronic device or a middleware module that combines diverse functions of the above-described components. According to an embodiment, the middleware 330 may provide a module specialized to each OS kind to provide differentiated functions. Additionally, the middleware 330 may dynamically remove a part of the preexisting components or may add new components thereto. The API 360 may be, for example, a set of programming functions and may be provided with a configuration that is variable depending on an OS. For example, in the case where an OS is the android or the iOS, it may provide one API set per platform. In the case where an OS is the tizen, it may provide two or more API sets per platform.

The application 370 may include, for example, applications such as a home 371, a dialer 372, an SMS/MMS 373, an instant message (IM) 374, a browser 375, a camera 376, an alarm 377, a contact 378, a voice dial 379, an e-mail 380, a calendar 381, a media player 382, an album 383, a watch 384, health care (e.g., measuring an exercise quantity, blood sugar, or the like) or offering of environment information (e.g., information of barometric pressure, humidity, temperature, or the like). According to an embodiment, the application 370 may include an information exchanging application to support information exchange between an electronic device and an external electronic device. The information exchanging application may include, for example, a notification relay application for transmitting specific information to an external electronic device, or a device management application for managing the external electronic device. For example, the notification relay application may include a function of transmitting notification information, which arise from other applications, to an external electronic device or may receive, for example, notification information from an external electronic device and provide the notification information to a user. The device management application may install, delete, or update for example, a function (e.g., turn-on/turn-off of an external electronic device itself (or a part of components) or adjustment of brightness (or resolution) of a display) of the external electronic device which communicates with the electronic device, and an application running in the external electronic device. According to an embodiment, the application 370 may include an application (e.g., a health care application of a mobile medical device) that is assigned in accordance with an attribute of an external electronic device. According to an embodiment, the application 370 may include an application that is received from an external electronic device. At least a portion of the program module 310 may be implemented by software, firmware, hardware (e.g., the processor 210), or a combination (e.g., execution) of two or more thereof, and may include modules, programs, routines, sets of instructions, processes, or the like for performing one or more functions.

Figure 4:
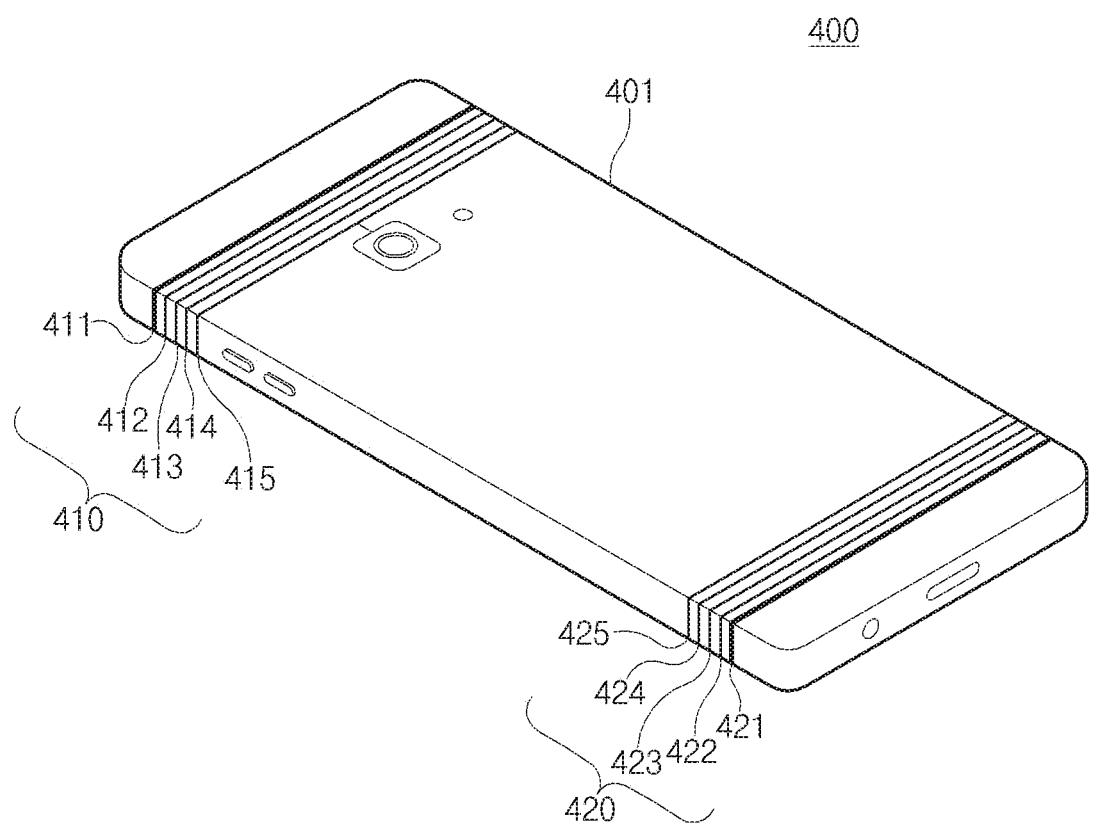
FIG. 4 is a perspective view of an electronic device according to an embodiment.

FIG. 4 is a perspective view of an electronic device according to an embodiment.

Referring to FIG. 4, an electronic device 400 according to an embodiment may include a housing 401, a first plurality of slits 410 arranged on an upper portion of the housing 401, and a second plurality of slits 420 arranged on a lower portion of the housing 401.

According to an embodiment, the housing 401 may cover at least a portion of a back surface of the electronic device 400. The housing 401 may cover at least a portion of a side surface of the electronic device 400 as well as the back surface of the electronic device 400. In the housing 401, the portion of the back surface and the portion of the side surface may be integrally formed. The housing 401 may be combined with a body including any other components of the electronic device 400. The housing 401 may cover a back surface and a side surface of the body. The housing 401 may be implemented to be removable from the body by a user or may be implemented to be fixed to the body. At least a portion of the housing 401 may include a conductive material. For example, the exterior of the housing 401 may be formed of metal. A portion, which is formed of metal, of the housing 401 may be used as an antenna radiator. For example, the upper portion and/or the lower portion of the housing 401 may be used as an antenna radiator.

According to an embodiment, the first plurality of slits 410 may include a first slit 411, a second slit 412, a third slit 413, a fourth slit 414, and a fifth slit 415. The first plurality of slits 410 may be formed in a transverse direction on the upper portion of the housing 401. For example, the first plurality of slits 410 may be formed toward an opposite end from one end of the upper portion of the housing 401. The first plurality of slits 410 may be filled with an insulating member. The first plurality of slits 410 may electrically separate the portions of the housing 401, which are positioned above and below each of the first plurality of slits 410. A width of the first slit 411 may be wider than widths of the second slit 412 to the fifth slit 415.

According to an embodiment, in the case where the widths of the second slit 412 to the fifth slit 415 is the same as the width of the first slit 411, the visibility of the first plurality of slits 410 may become relatively high. The visibility of the first plurality of slits 410 may become relatively low by forming a width of a part (e.g., the first slit 411) of the first plurality of slits 410 greatly and forming a width of another part (e.g., the second slit 412 to the fifth slit 415) small.

An example is illustrated in FIG. 4 as the electronic device 400 includes the first plurality of slits 410, the number of which is "5". However, the disclosure is not limited thereto. For example, the electronic device 400 may include two or more slits.

According to an embodiment, the second plurality of slits 420 may include a sixth slit 422, a seventh slit 422, an eighth slit 423, a ninth slit 424, and a tenth slit 425. The second plurality of slits 420 may be formed in a transverse direction on the lower portion of the housing 401. For example, the second plurality of slits 420 may be formed toward an opposite end from one end of the lower portion of the housing 401. For example, the second plurality of slits 420 may be implemented to be symmetrical to the first plurality of slits 410. The second plurality of slits 420 may be used similarly to the first plurality of slits 410.

An example is illustrated in FIG. 4 as the electronic device 400 includes the second plurality of slits 420, the number of which is "5". However, the disclosure is not limited thereto. For example, the electronic device 400 may include two or more slits.

According to an embodiment, a description is given with reference to FIG. 4 as the second plurality of slits 420 are implemented similarly to the first plurality of slits 410. However, the disclosure is not limited thereto. For example, the second plurality of slits 420 may be implemented differently from the first plurality of slits 410 of FIG. 4 in structure. Also, the first plurality of slits 410 may be implemented differently from the second plurality of slits 420 of FIG. 4 in structure.

Figure 5A:
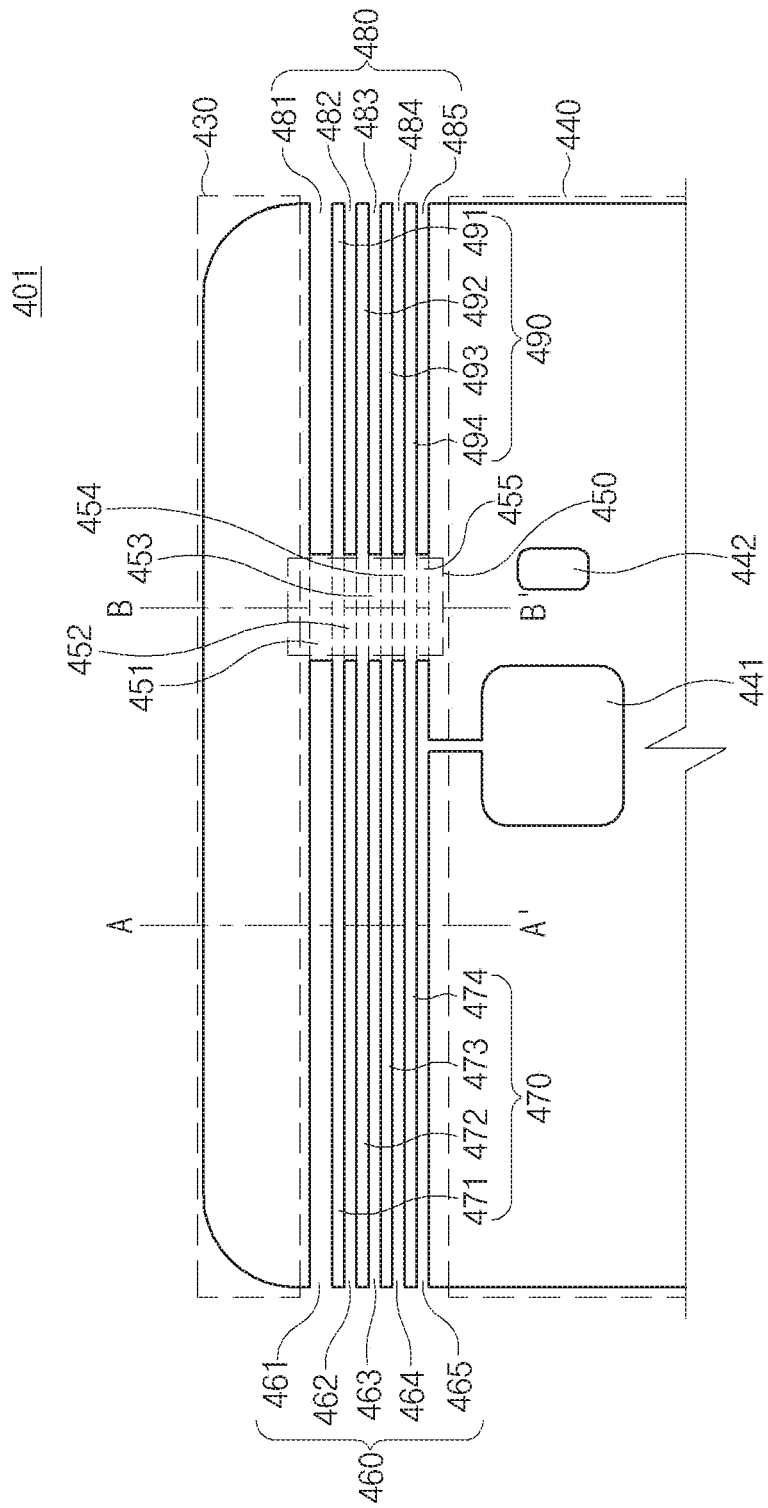
FIG. 5A illustrates a portion of a housing included in an electronic device according to an embodiment.
Figure 5B:
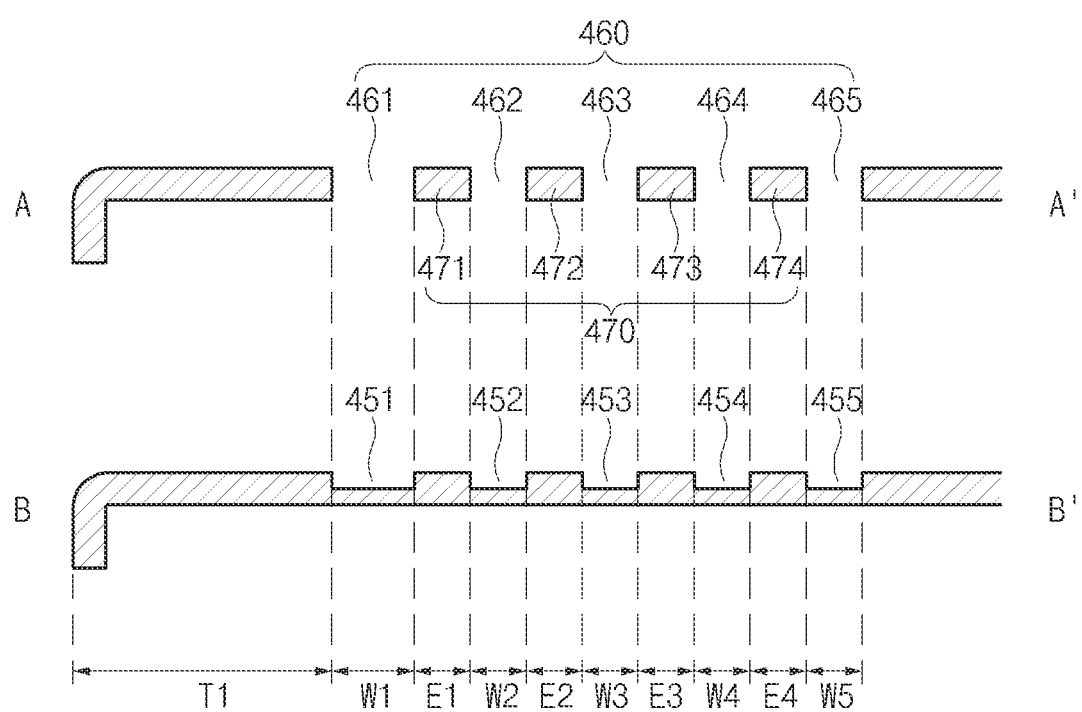
FIG. 5B is a cross-sectional view of a housing according to an embodiment, which is taken along a line A-A' and a line B-B' of FIG. 5A.

FIG. 5A illustrates a portion of a metal housing included in an electronic device according to an embodiment. FIG. 5B is a cross-sectional view of a metal housing according to an embodiment, which is taken along a line A-A' and a line B-B' of FIG. 5A. For convenience of description, a description will be given with reference to FIGS. 5A and 5B together.

Referring to FIGS. 5A and 5B, the housing 401 of an electronic device according to an embodiment may include an upper end portion 430, a center portion 440, a connection part 450, a plurality of first extensions 470, and a plurality of second extensions 490.

According to an embodiment, the housing 401 may cover at least a portion of a back surface of the electronic device. The housing 401 may cover at least a portion of the back surface of the electronic device and at least a portion of a side surface thereof. The housing 401 may include a conductive material.

According to an embodiment, a plurality of slits 460 and 480 may be formed in the housing 401. The plurality of slits 460 and 480 may be formed toward an opposite end from one end of the housing 401. For example, the plurality of left slits 460 may extend from a left end of the housing 401 toward a right end thereof. The plurality of left slits 460 may include a first left slit 461, a second left slit 462, a third left slit 463, a fourth left slit 464, and a fifth left slit 465. For another example, the plurality of right slits 480 may extend toward the left end from the right end of the housing 401. The plurality of right slits 480 may include a first right slit 481, a second right slit 482, a third right slit 483, a fourth right slit 484, and a fifth right slit 485.

According to an embodiment, the upper end portion 430 of the housing 401 may be a portion that is positioned above the plurality of slits 460 and 480. The upper end portion 430 of the housing 401 may be used as a radiator of an antenna. The upper end portion 430 of the housing 401 may be electrically connected with a feeder on a printed circuit board that is positioned under the housing 401.

According to an embodiment, the center portion 440 of the housing 401 may be a portion that is positioned below the plurality of slits 460 and 470. The center portion 440 of the housing 401 may be used as a ground plate of an antenna. The center portion 440 of the housing 401 may be electrically connected with a ground part on a printed circuit board that is positioned under the housing 401. A camera hole 441 for exposing a camera or an LED hole 442 for exposing an LED may be formed in the center portion 440 of the housing 401.

According to an embodiment, the connection part 450 of the housing 401 may connect the upper end portion 430 and the center portion 440 of the housing 401. A plurality of grooves 451, 452, 453, 454, and 455 may be formed in the connection part 450 of the housing 401.

According to an embodiment, the plurality of grooves 451, 452, 453, 454, and 455 may be formed such that the plurality of left slits 460 and the plurality of right slits 480 are connected. For example, the first groove 451 may be formed such that the first left slit 461 and the first right slit 481 are connected. The first groove 451, the first left slit 461, and the first right slit 481 may be filled with an insulating member. The second groove 452 to the fifth groove 455 may be formed such that the second left slit 462 to the fifth left slit 465 and the second right slit 482 to the fifth right slit 485 are respectively connected. The second groove 452 to the fifth groove 455, the second left slit 462 to the fifth left slit 465, and the second right slit 482 to the fifth right slit 485 may be filled with an insulating member.

According to an embodiment, the plurality of extensions 470 and 490 may extend toward one side from the connection part 450. The plurality of extensions 470 and 490 may be interposed between the plurality of slits 460 and 480, respectively. For example, the plurality of left extensions 470 may extend toward a left end from the connection part 450 and may be interposed between the plurality of left slits 460. The plurality of left extensions 470 may include a first left extension 471, a second left extension 472, a third left extension 473, and a fourth left extension 474. The first left extension 471 may be interposed between the first left slit 461 and the second left slit 462. The fourth left extension 474 may be interposed between the fourth left slit 464 and the fifth left slit 465. For another example, the plurality of right extensions 490 may extend toward a right side from the connection part 450 and may be interposed between the plurality of right slits 480. The plurality of right extensions 490 may include a first right extension 491, a second right extension 492, a third right extension 493, and a fourth right extension 494.

For convenience of description, a description is given with reference to FIG. 5A as the housing 401 is separated into the upper end portion 430, the center portion 440, the connection part 450, and the plurality of extensions 470 and 490, but the upper end portion 430, the center portion 440, the connection part 450, and the plurality of extensions 470 and 490 of the housing 401 may be integrally formed.

According to an embodiment, a part of the plurality of slits 460 and 480 may include a section that is greater in width than any other part of the plurality of slits 460 and 480. According to an embodiment, a width of a part of the plurality of slits 460 and 480 may be greater than a width of any other part of the plurality of slits 460 and 480.

According to an embodiment, a width of a slit, which is adjacent to the upper end portion 430 of the housing 401, from among the plurality of slits 460 and 480 may be greater than a width of any other slit. For example, widths W1 of the first left slit 461 and the first right slit 481 may be greater than widths W2, W3, W4, and W5 of the second left slit 462 to the fifth left slit 465 and the second right slit 482 to the fifth right slit 485. The widths W1 of the first left slit 461 and the first right slit 481 may be, for example, about 0.15 mm. Each of the widths W2, W3, W4, and W5 of the second left slit 462 to the fifth left slit 465 and the second right slit 482 to the fifth right slit 485 may be, for example, about 0.1 mm. A longitudinal length T1 of the upper end portion 430 of the housing 401 may be, for example, about 7.5 mm. Each of widths E1, E2, E3, and E4 of the plurality of extensions 470 and 490 may be, for example, about 0.6 mm. Because the first left extension 471 affecting performance of an antenna radiator is further spaced from the upper end portion 430 of the housing 401 used as an antenna radiator by increasing a width of a slit adjacent to the upper end portion 430 of the housing 401, performance of an antenna may be improved.

According to an embodiment, an example is illustrated in FIG. 5A as five left slits and five right slits are formed in the housing 401, but the disclosure is not limited thereto. For example, two or more left slits and two or more right slits may be formed.

An example is illustrated in FIG. 5A as widths of the first left slit 461 and the first right slit 481 are formed to be greater, but the disclosure is not limited thereto. For example, widths of the plurality of left slits 460 and the plurality of right slits 480 may be variously changed.

For example, a width of a peripheral slit of the plurality of slits 460 and 480 may be formed to be greater than a width of any other slit. For example, a width of each of the first left slit 461, the first right slit 481, the fifth left slit 465, and the fifth right slit 485 may be, for example, about 0.15 mm. A width of each of the second left slit 462 to the fourth left slit 464 and the second right slit 482 to the fourth right slit 484 may be, for example, about 0.1 mm. Each of widths of the plurality of extensions 470 and 490 may be, for example, about 0.6 mm.

For another example, widths of the first left slit 461, the first right slit 481, the third left slit 463, the third right slit 483, the fifth left slit 465, and the fifth right slit 485 may be formed to be greater than widths of the remaining slits. For example, a width of each of the first left slit 461, the first right slit 481, the third left slit 463, the third right slit 483, the fifth left slit 465, and the fifth right slit 485 may be, for example, about 0.15 mm. A width of each of the second left slit 462, the second right slit 482, the fourth left slit 464, and the fourth right slit 484 may be, for example, about 0.1 mm. A width of the plurality of extensions 470 and 490 may be, for example, about 0.6 mm.

For another example, widths of the third left slit 463 and the third right slit 483 of the plurality of slits 460 and 480 may be formed to be greater than widths of the remaining slits. For example, a width of each of the third left slit 463 and the third right slit 483 may be, for example, about 0.15 mm. A width of each of the first left slit 461, the first right slit 481, the second left slit 462, the second right slit 482, the fourth left slit 464, the fourth right slit 484, the fifth left slit 465, and the fifth right slit 485 may be, for example, about 0.1 mm. A width of each of the plurality of extensions 470 and 490 may be, for example, about 0.6 mm.

For another example, a width of each of the plurality of slits 460 and 480 may be formed to become greater as a distance from the upper end portion 430 decreases. For example, a width of each of the plurality of slits 460 and 480 may gradually become greater as a distance from the upper end portion 430 decreases.

An example is illustrated in FIGS. 5A and 5B as the plurality of left extensions 470 and the plurality of right extensions 490 are included in the housing 401, but the disclosure is not limited thereto. For example, in the case where two slits are formed on the right of the housing 401 and two slits are formed on the left of the housing 401, the housing 401 may include one left extension and one right extension. In the specification, a plurality of extensions, a plurality of left extensions, and a plurality of right extensions may mean two or more extensions, two or more left extensions, and two or more right extensions, but the disclosure is not limited thereto. For example, a plurality of extensions, a plurality of left extensions, or a plurality of right extensions may be replaced with one extension, one left extension, or one right extension.

Figure 5C:
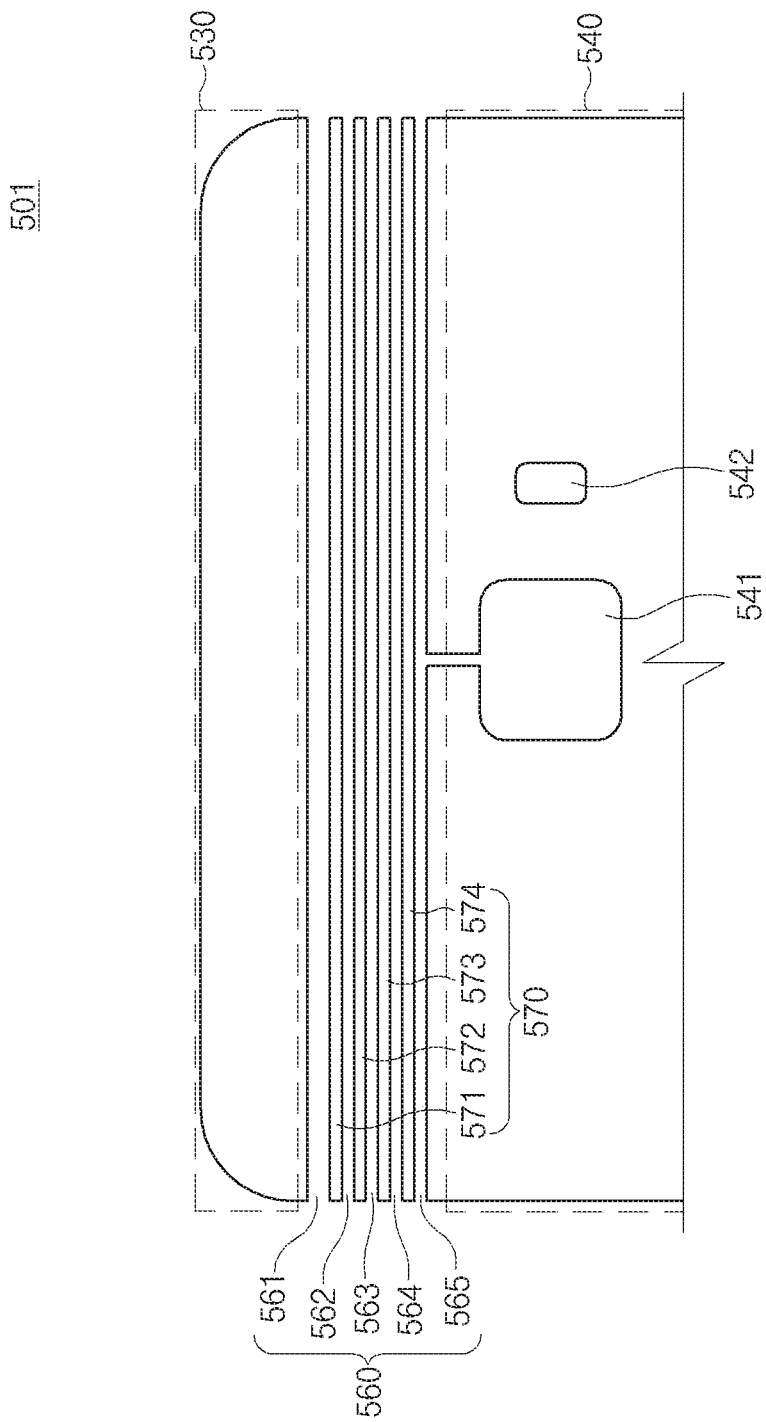
FIG. 5C illustrates a portion of a housing included in an electronic device according to an embodiment.

FIG. 5C illustrates a portion of a housing included in an electronic device according to an embodiment.

Referring to FIG. 5C, a housing 501 according to an embodiment may include an upper end portion 530, a center portion 540, and a plurality of extensions 570.

According to an embodiment, a plurality of slits 560 may be formed in the housing 501. The plurality of slits 560 may be formed to an opposite end from one end of the housing 501. For example, the plurality of slits 560 may include a first slit 561, a second slit 562, a third slit 563, a fourth slit 564, and a fifth slit 565.

According to an embodiment, the upper end portion 530 of the housing 501 may be a portion that is positioned above the plurality of slits 560. The upper end portion 530 of the housing 501 may be used as a radiator of an antenna. The upper end portion 530 of the housing 501 may be electrically connected with a feeder on a printed circuit board that is positioned under the housing 501.

According to an embodiment, the center portion 540 of the housing 501 may be a portion that is positioned below the plurality of slits 560. The center portion 540 of the housing 501 may be used as a ground plate of an antenna. The center portion 540 of the housing 501 may be electrically connected with a ground part on a printed circuit board that is positioned under the housing 501. A camera hole for exposing a camera or an LED hole for exposing an LED may be formed in the center portion 540 of the housing 501.

According to an embodiment, the plurality of extensions 570 may be formed to the opposite end from the one end of the housing 501. The plurality of extensions 570 may be interposed between the plurality of slits 560, respectively. The plurality of extensions 570 may include a first extension 571, a second extension 572, a third extension 573, and a fourth extension 574.

According to an embodiment, a width of a slit, which is adjacent to the upper end portion 530 of the housing 501, from among the plurality of slits 560 may be greater than a width of any other slit. For example, a width of the first slit 561 may be greater than widths of the second slit 562 to the fifth slit 565. The width of the first slit 561 may be, for example, about 0.15 mm. For example, a width of each of the second slit 562 to the fifth slit 565 may be, for example, about 0.10 mm. A longitudinal length of the upper end portion 530 of the housing 501 may be, for example, about 7.5 mm.

An example is illustrated in FIG. 5C as five slits 560 are formed in the housing 501, but the disclosure is not limited thereto. For example, the number of slits may be two or more.

An example is illustrated in FIG. 5C as a width of the first slit 561 is formed to be greater than any other slit, but the disclosure is not limited thereto. For example, a width of each of the first slit 561 to the fifth slit 565 may be variously changed.

An example is illustrated in FIG. 5C as the plurality of extensions 570 are included in the housing 501, but the disclosure is not limited thereto. For example, in the case where two slits are formed in the housing 501, the housing 501 may include one extension.

Figure 6:
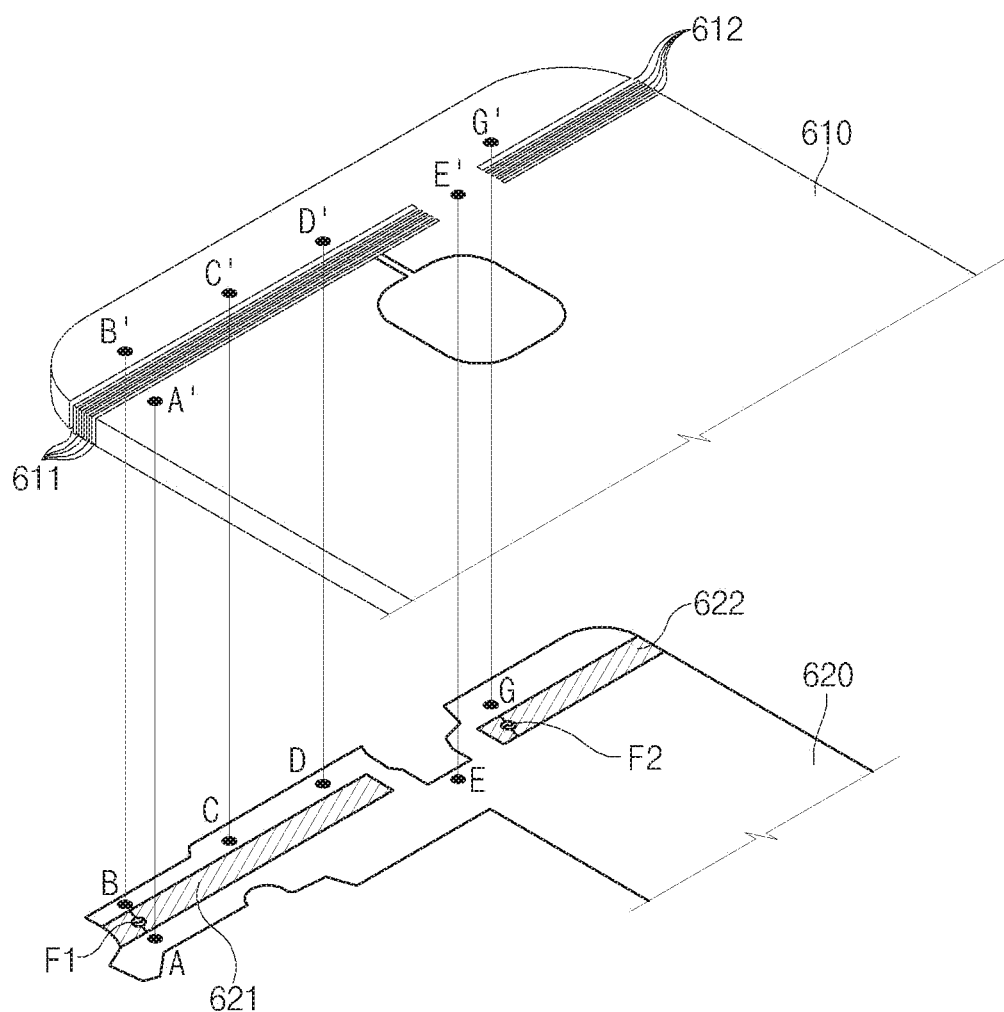
FIG. 6 illustrates a housing and a printed circuit board included in an electronic device according to an embodiment.

FIG. 6 illustrates a housing and a printed circuit board included in an electronic device according to an embodiment.

Referring to FIG. 6, an electronic device according to an embodiment may include a housing 610 and a printed circuit board 620.

The housing 610 may be positioned to cover a back surface of the electronic device. The housing 610 illustrated in FIG. 6 may be the housing 401 illustrated in FIG. 5A. For convenience of description, with regard to the housing 610, additional description will be omitted to avoid redundancy.

According to an embodiment, the printed circuit board 620 may be positioned under the housing 610. The printed circuit board 620 may be positioned parallel to the housing 610. A first area 621 of the printed circuit board 620, which corresponds to a plurality of left slits 611 formed in the housing 610 may be formed of a nonconductive material. A second area 622 of the printed circuit board 620, which corresponds to a plurality of right slits 612 formed in the housing 610 may be formed of a nonconductive material. The first area 621 and the second area 622 may be, for example, a fill cut area.

According to an embodiment, points "A", "B", "C", and "D" of the printed circuit board 620 may be points adjacent to the first area 621. The point "B" may be electrically connected with a first feeder F1. For example, the point "B" may be electrically connected with a (+) terminal of the first feeder F1. The printed circuit board 620 may be supplied with a power through the point "B". The point "A", "C", or "D" may be electrically connected with, for example, a support member. The points "A", "B", "C", and "D" may be electrically connected with points A', B', C', and D' of the housing 610, respectively. The points A', B', C', and D' of the housing 610 may be points adjacent to the plurality of left slits 611 formed in the housing 610.

According to an embodiment, points "E" and "G" of the printed circuit board 620 may be points adjacent to the second area 622. The point "G" may be electrically connected with a second feeder F2. For example, the point "G" may be electrically connected with a (+) terminal of the second feeder F2. The printed circuit board 620 may be supplied with a power through the point "G". The point "E" may be electrically connected with, for example, a support member. The points "E" and "G" may be electrically connected with points E' and G' of the housing 610, respectively. The points E' and G' of the housing 610 may be points adjacent to the plurality of right slits 612 formed in the housing 610.

According to an embodiment, the above points "A", "B", "C", "D", and "G" may be electrically connected with the points A', B', C', D', E', and G' through a connection member, such as a C-clip, respectively.

Below, a structure and an operation of an antenna included in an electronic device using the housing 401 as a radiator will be described with reference to FIG. 7.

Figure 7:
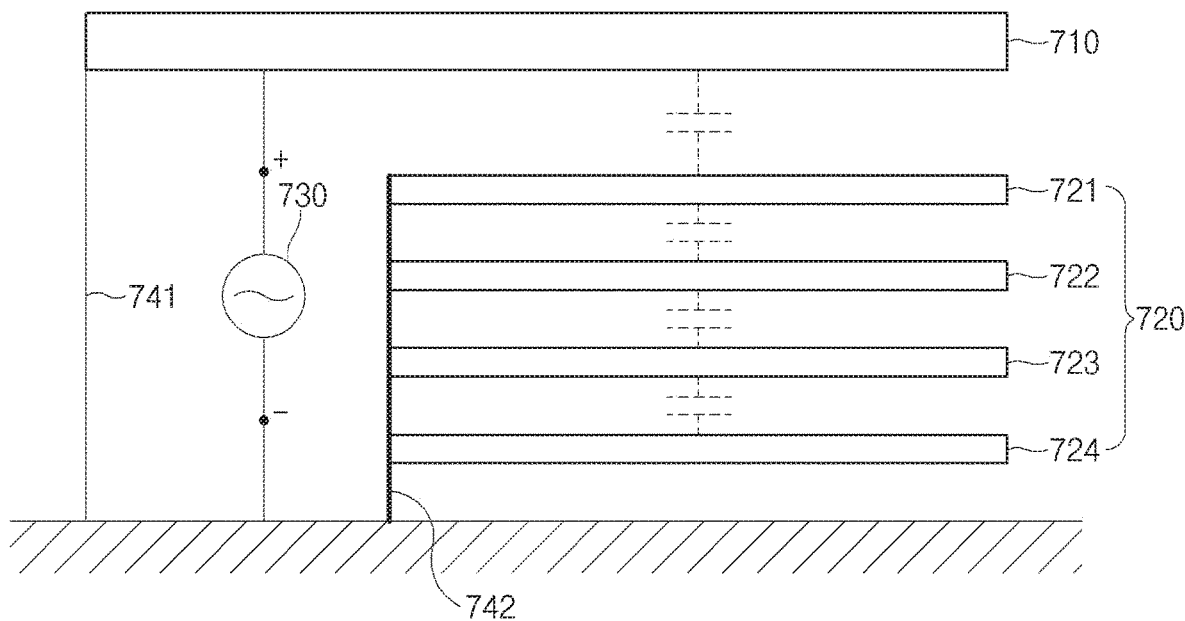
FIG. 7 schematically illustrates an antenna included in an electronic device according to an embodiment.

FIG. 7 schematically illustrates an antenna included in an electronic device according to an embodiment.

Referring to FIG. 7, an antenna included in an electronic device 700 according to an embodiment may include an antenna radiator 710, a plurality of metal members 720, a feeder 730, a first ground part 741, and a second ground part 742.

According to an embodiment, for example, the antenna radiator 710 may be a component that is the same as or similar to the upper end portion 430 of the housing 401 illustrated in FIGS. 5A and 5B. The antenna radiator 710 may radiate an electrical signal transferred from the feeder 730 to the outside. The antenna radiator 710 may receive an electrical signal from the outside.

According to an embodiment, the plurality of metal members 720 may include a first metal member 721, a second metal member 722, a third metal member 723, and a fourth metal member 724. For example, the first metal member 721, the second metal member 722, the third metal member 723, and the fourth metal member 724 may be components that are the same as or similar to the first left extension 471, the second left extension 472, the third left extension 473, and the fourth left extension 474 illustrated in FIGS. 5A and 5B, respectively.

According to an embodiment, a slit (e.g., the first left slit 461 illustrated in FIGS. 5A and 5B) may be formed between the antenna radiator 710 and the first metal member 721. The antenna radiator 710 and the first metal member 721 may be spaced from each other by the slit. A distance between the antenna radiator 710 and the first metal member 721 may increase by increasing a width of the slit, and thus, a capacitance between the antenna radiator 710 and the first metal member 721 may decrease. For example, a current that is leaked out from the antenna radiator 710 to the first metal member 721 may decrease, and efficiency of an antenna may be improved.

According to an embodiment, the feeder 730 may be electrically connected with the antenna radiator 710. For example, the feeder 730 may be electrically connected with at least one point of the housing 401 of FIGS. 5A and 5B, and, for example, may be connected with at least one point of the upper end portion 430 of the housing 401. For example, the feeder 730 may be an electrical path in a printed circuit board, and may be electrically connected with the antenna radiator 710 through a connection member such as a C-clip. The feeder 730 may transfer an electrical signal to the antenna radiator 710.

According to an embodiment, the first ground part 741 may be electrically connected with the antenna radiator 710. For example, the first ground part 741 may be electrically connected with at least one point of the housing 401 of FIGS. 5A and 5B. The first ground part 741 may be electrically connected with at least one point of the center portion 440 of the housing 401. For example, the first ground part 741 may be an electrical path in the printed circuit board, and may be electrically connected with the antenna radiator 710 through a connection member such as a C-clip. The antenna radiator 710 may be grounded by the first ground part 741.

According to an embodiment, the second ground part 742 may be electrically connected with the plurality of metal members 720. For example, the second ground part 742 may be an electrical path in the printed circuit board, and may be electrically connected with the plurality of metal members 720 through a connection member such as a C-clip. The plurality of metal members 720 may be grounded by the second ground part 742.

According to an embodiment, the antenna radiator 710 may be electrically coupled with the first metal member 721. The first metal member 721 may be electrically coupled with the second metal member 722. The second metal member 722 may be electrically coupled with the third metal member 723. The third metal member 723 may be electrically coupled with the fourth metal member 724. When the antenna radiator 710 is coupled with the first metal member 721, a portion of a current that flows to the antenna radiator 710 may be leaked out to the first metal member 721.

Figure 8:
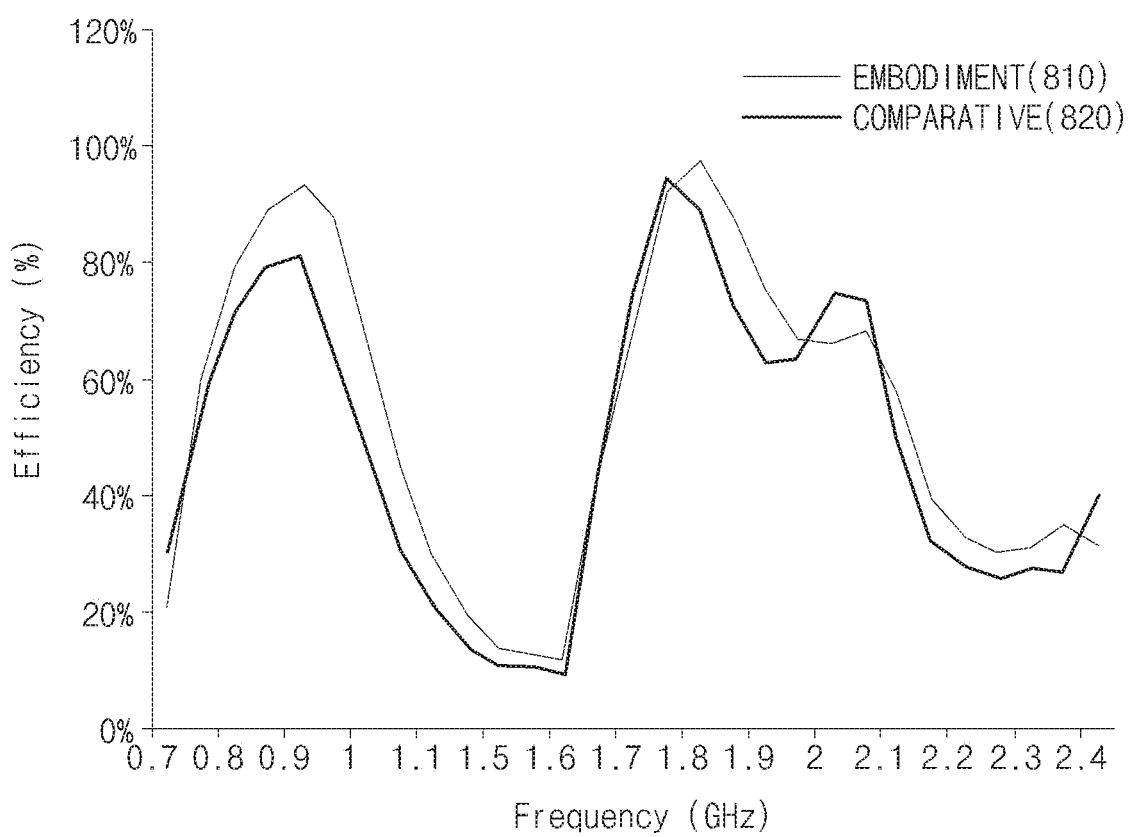
FIG. 8 is a graph illustrating an efficiency of an antenna included in an electronic device for each frequency, according to an embodiment.

FIG. 8 is a graph illustrating an efficiency of an antenna included in an electronic device for each frequency, according to an embodiment.

An electronic device according to an embodiment is an electronic device that uses the housing 410 illustrated in FIGS. 5A and 5B (e.g., a width of the first left slit 461 is about 0.15 mm and widths of the second left slit 462 to the fifth left slit 465 are about 0.1 mm) as an antenna radiator, and an electronic device according to a comparative example is an electronic device that uses a housing, in which a plurality of slits all have a uniform width (e.g., about 0.1 mm), as an antenna radiator.

Referring to FIG. 8, a first curve 810 indicates an efficiency of an antenna included in the electronic device according to an embodiment for each frequency, and a second curve 820 indicates an efficiency of an antenna included in the electronic device according to the comparative example for each frequency. In most of a frequency band, the efficiency of the antenna according to the embodiment may be higher than the efficiency of the antenna according to the comparative example. For example, it may be observed that, in a band of about 0.9 GHz, the efficiency of the antenna according to the embodiment is about 90% and the efficiency of the antenna according to the comparative example is about 80%. For another example, it may be observed that, in a band of about 1.8 GHz, the efficiency of the antenna according to the embodiment is higher than the efficiency of the antenna according to the comparative example as much as about 2%. As a width of a part of a plurality of slits increases, the visibility of the slit may decrease, and an efficiency of an antenna may be improved.

Figure 9:
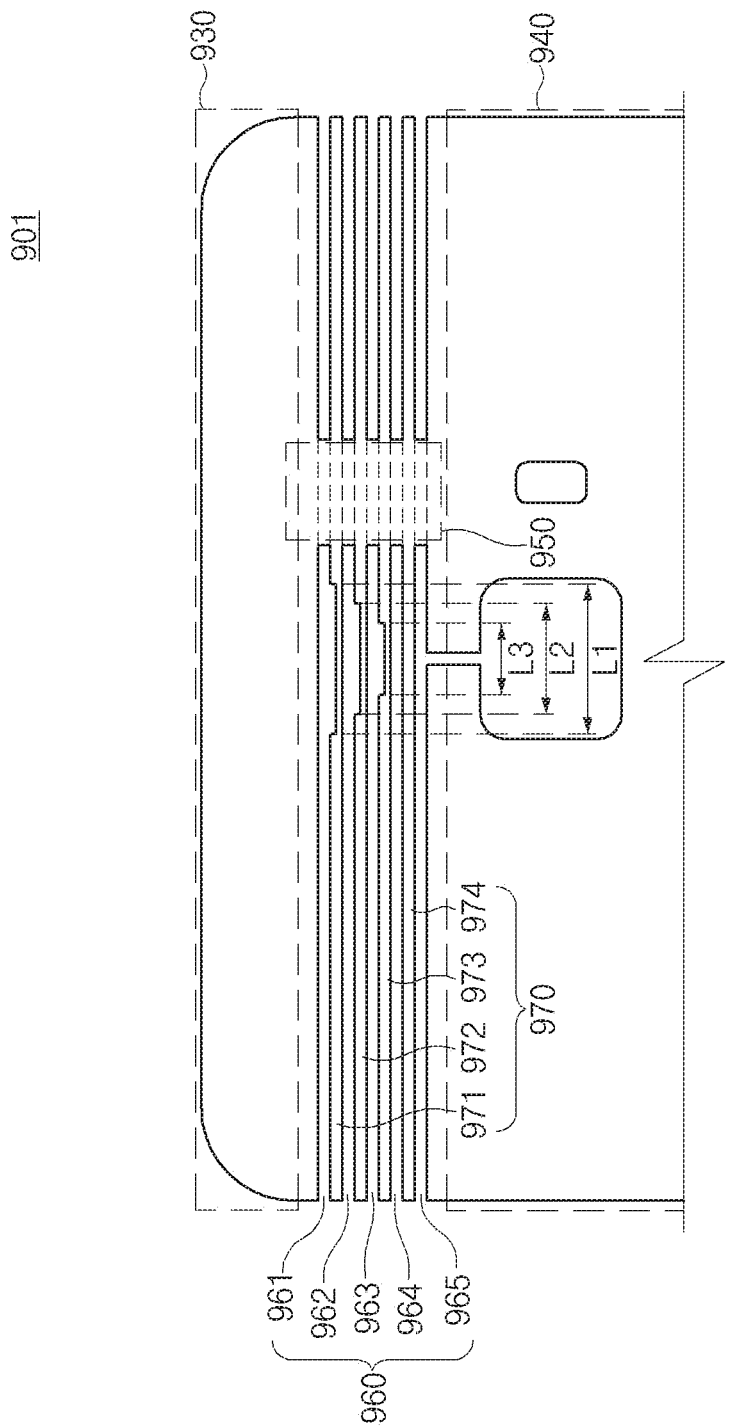
FIG. 9 illustrates a portion of a housing included in an electronic device according to an embodiment.

FIG. 9 illustrates a portion of a housing included in an electronic device according to an embodiment. For descriptive convenience, with regard to the configuration described with reference to FIGS. 5A and 5B, additional description will be omitted to avoid redundancy.

Referring to FIG. 9, a housing 901 included in an electronic device according to an embodiment may include an upper end portion 930, a center portion 940, a connection part 950, and a plurality of extensions 970. The upper end portion 930, the center portion 940, and the connection part 950 of the housing 901 may be components that are the same as or similar to the upper end portion 430, the center portion 440, and the connection part 450 of the housing 401 illustrated in FIG. 4.

According to an embodiment, a plurality of slits 960 may be formed in the housing 901. The plurality of slits 960 may be formed toward an opposite end from one end of the housing 901. For example, the plurality of slits 960 may extend from a left end of the housing 901 toward a right end thereof. The plurality of slits 960 may include a first slit 961, a second slit 962, a third slit 963, a fourth slit 964, and a fifth slit 965.

According to an embodiment, at least one of the plurality of slits 960 may include a portion where a width of at least a portion is different. For example, a width of a partial section of a part of the plurality of slits 960 may be greater than a width of another partial section of the part of the plurality of slits 960. According to an embodiment, a length of a section that is greater in width than another section may increase as a distance from the upper end portion 930 of the housing 901 decreases.

For example, the first slit 961 may include a section, which is greater in width than another section of the first slit 961, on a center portion of the housing 901. A length of the section, which is great in width, of the first slit 961 may be, for example, L1. The second slit 962 may include a section, which is greater in width than another section of the second slit 962, on the center portion of the housing 901. A length of the section, which is great in width, of the second slit 962 may be, for example, L2. The third slit 963 may include a section, which is greater in width than another section of the third slit 963, on the center portion of the housing 901. A length of the section, which is great in width, of the third slit 963 may be, for example, L3. The length L1 of the section, which is great in width, of the first slit 961 may be greater than the length L2 of the section, which is great in width, of the second slit 962, and the length L2 of the section, which is great in width, of the second slit 962 may be greater than the length L3 of the section, which is great in width, of the third slit 963. For example, widths of a first extension 971, a second extension 972, and a third extension 973 may become small in a section where widths of the first slit 961, the second slit 962, and the third slit 963 are great.

An example is illustrated in FIG. 9 as a section of a great width is positioned on the center portion of the housing 901, but the disclosure is not limited thereto. For example, a section of a great width may be positioned on any other portion.

According to an embodiment, an example is illustrated in FIG. 9 as widths of the sections that are great in width are the same, but the disclosure is not limited thereto. For example, widths of the sections that are great in width may be determined differently for each slit. For example, a width of a section that is great in width may become greater as a distance from the upper end portion 930 of the housing 901 decreases. For example, a width of a section, which is great in width, of the first slit 961 may be greater than a width of a section, which is great in width, of the second slit 962, and the width of the section, which is great in width, of the second slit 962 may be greater than a width of a section, which is great in width, of the third slit 963.

An example is illustrated in FIG. 9 as the housing 901 includes the plurality of extensions 970, but the disclosure is not limited thereto. For example, the housing 901 may include one metal member. In the specification, a plurality of extensions mean two or more extensions, but the disclosure is not limited thereto. For example, a plurality of extensions may be replaced with one extension.

Figure 10:
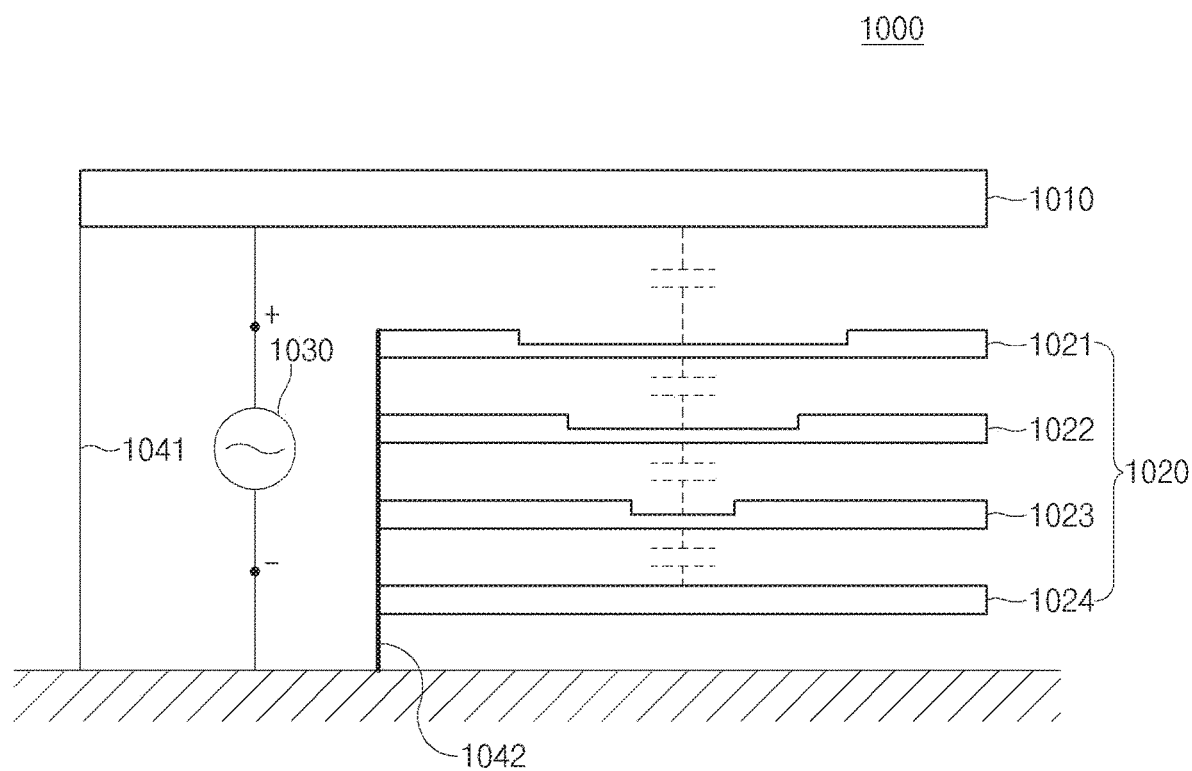
FIG. 10 schematically illustrates an antenna included in an electronic device according to an embodiment.

FIG. 10 schematically illustrates an antenna included in an electronic device according to an embodiment.

Referring to FIG. 10, an antenna included in an electronic device 1000 according to an embodiment may include an antenna radiator 1010, a plurality of metal members 1020, a feeder 1030, a first ground part 1041, and a second ground part 1042.

For example, the antenna radiator 1010 may be a component that is the same as or similar to the upper end portion 930 of the housing 901 illustrated in FIG. 9. The antenna radiator 1010 may radiate an electrical signal transferred from the feeder 1030 to the outside. The antenna radiator 1010 may receive an electrical signal from the outside.

According to an embodiment, the plurality of metal members 1020 may include a first metal member 1021, a second metal member 1022, a third metal member 1023, and a fourth metal member 1024. For example, the first metal member 1021, the second metal member 1022, the third metal member 1023, and the fourth metal member 1024 may be components that are the same as or similar to the first extension 971, the second extension 972, the third extension 973, and the fourth extension 974 illustrated in FIG. 9, respectively.

According to an embodiment, a slit (e.g., the first slit 961 illustrated in FIG. 9) may be formed between the antenna radiator 1010 and the first metal member 1021. The antenna radiator 1010 and the first metal member 1021 may be spaced from each other by the first slit 961. A width of a partial section of the first slit 961 may be greater than a width of any other section, and a width of a partial section of the first metal member 1021 corresponding to the partial section of the first slit 961 may be smaller than a width of any other section. A distance between the antenna radiator 1010 and the first metal member 1021 may increase by increasing a width of a partial section of the first slit 961, and thus, a capacitance between the antenna radiator 1010 and the first metal member 1021 may decrease. The second slit 962 illustrated in FIG. 9 may be formed between the first metal member 1021 and the second metal member 1022. The third slit 963 illustrated in FIG. 9 may be formed between the second metal member 1022 and the third metal member 1023. A capacitance between the first metal member 1021 and the second metal member 1022 may decrease, and a capacitance between the second metal member 1022 and the third metal member 1023 may decrease. A current that is leaked out from the antenna radiator 1010 to the first metal member 1021 may decrease, and efficiency of an antenna may be improved.

The feeder 1030, the first ground part 1041, and the second ground part 1042 may be components that are the same as or similar to the feeder 730, the first ground part 741, and the second ground part 742 illustrated in FIG. 7, respectively.

According to an embodiment, the antenna radiator 1010 may be electrically coupled with the first metal member 1021. The first metal member 1021 may be electrically coupled with the second metal member 1022. The second metal member 1022 may be electrically coupled with the third metal member 1023. The third metal member 1023 may be electrically coupled with the fourth metal member 1024. When the antenna radiator 1010 is coupled with the first metal member 1021, a portion of a current that flows to the antenna radiator 1010 may be leaked out to the first metal member 1021.

An example is illustrated in FIG. 10 as the electronic device 1000 includes the plurality of metal members 1020, but the disclosure is not limited thereto. For example, the electronic device 1000 may include one metal member. In the specification, a plurality of metal members means two or more metal members, but the disclosure is not limited thereto. For example, a plurality of metal members may be replaced with one metal member.

Figure 11:
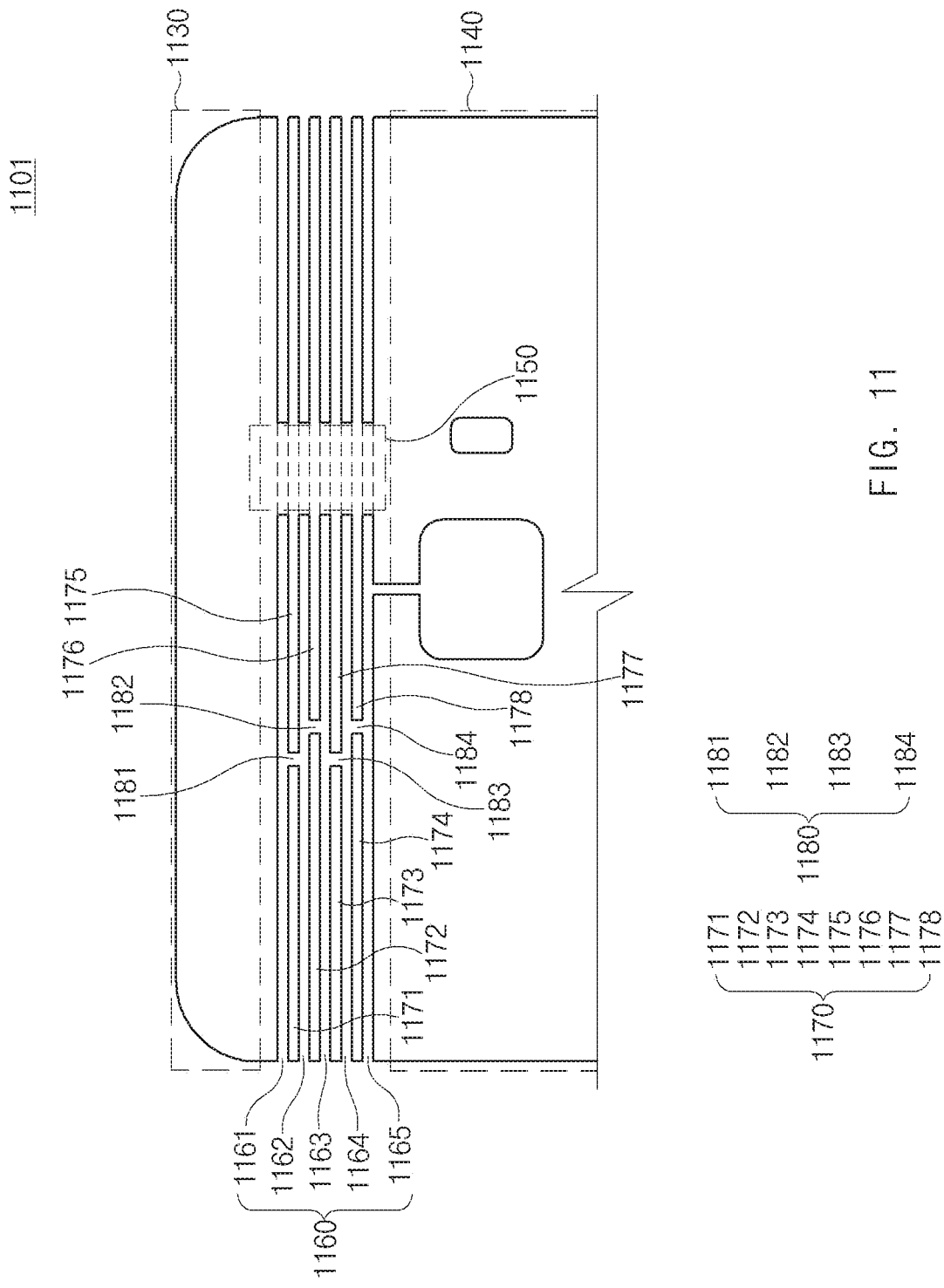
FIG. 11 illustrates a portion of a housing included in an electronic device according to an embodiment.

FIG. 11 illustrates a portion of a housing included in an electronic device according to an embodiment.

Referring to FIG. 11, a housing 1101 included in an electronic device according to an embodiment may include an upper end portion 1130, a center portion 1140, a connection part 1150, and a plurality of extensions 1170. The upper end portion 1130, the center portion 1140, and the connection part 1150 of the housing 1101 may be components that are the same as or similar to the upper end portion 430, the center portion 440, and the connection part 450 of the housing 401 illustrated in FIG. 4.

According to an embodiment, a plurality of slits 1160 may be formed in the housing 1101. The plurality of slits 1160 may be formed toward an opposite end from one end of the housing 1101. For example, the plurality of slits 1160 may extend from a left end of the housing 1101 toward a right end thereof. The plurality of slits 1160 may include a first slit 1161, a second slit 1162, a third slit 1163, a fourth slit 1164, and a fifth slit 1165.

According to an embodiment, at least one gap 1180 that connects one slit of the plurality of slits 1160 and another slit of the plurality of slits 1160 may be defined in the housing 1101. For example, a first gap 1181 may be defined between the first slit 1161 and the second slit 1162 and may connect the first slit 1161 and the second slit 1162. A second gap 1182 may be defined between the second slit 1162 and the third slit 1163 and may connect the second slit 1162 and the third slit 1163. A third gap 1183 may be defined between the third slit 1163 and the fourth slit 1164 and may connect the third slit 1163 and the fourth slit 1164. A fourth gap 1184 may be defined between the fourth slit 1164 and the fifth slit 1165 and may connect the fourth slit 1164 and the fifth slit 1165. An example is illustrated in FIG. 11 as the plurality of gaps 1180 are respectively defined in the plurality of extensions, but the disclosure is not limited thereto. For example, a gap may be defined only in a part of the plurality of extensions 1170.

According to an embodiment, the plurality of extensions 1170 may be segmented by the plurality of gaps 1180. For example, one of the plurality of extensions 1170 may be segmented into a first extension 1171 and a fifth extension 1175. Another of the plurality of extensions 1170 may be segmented into a second extension 1172 and a sixth extension 1176. Another of the plurality of extensions 1170 may be segmented into a third extension 1173 and a seventh extension 1177. The other of the plurality of extensions 1170 may be segmented into a fourth extension 1174 and an eighth extension 1178.

An example is illustrated in FIG. 11 as the housing 1101 includes the plurality of extensions 1170, but the disclosure is not limited thereto. For example, the housing 1101 may include two extensions adjacent to each other.

Figure 12:
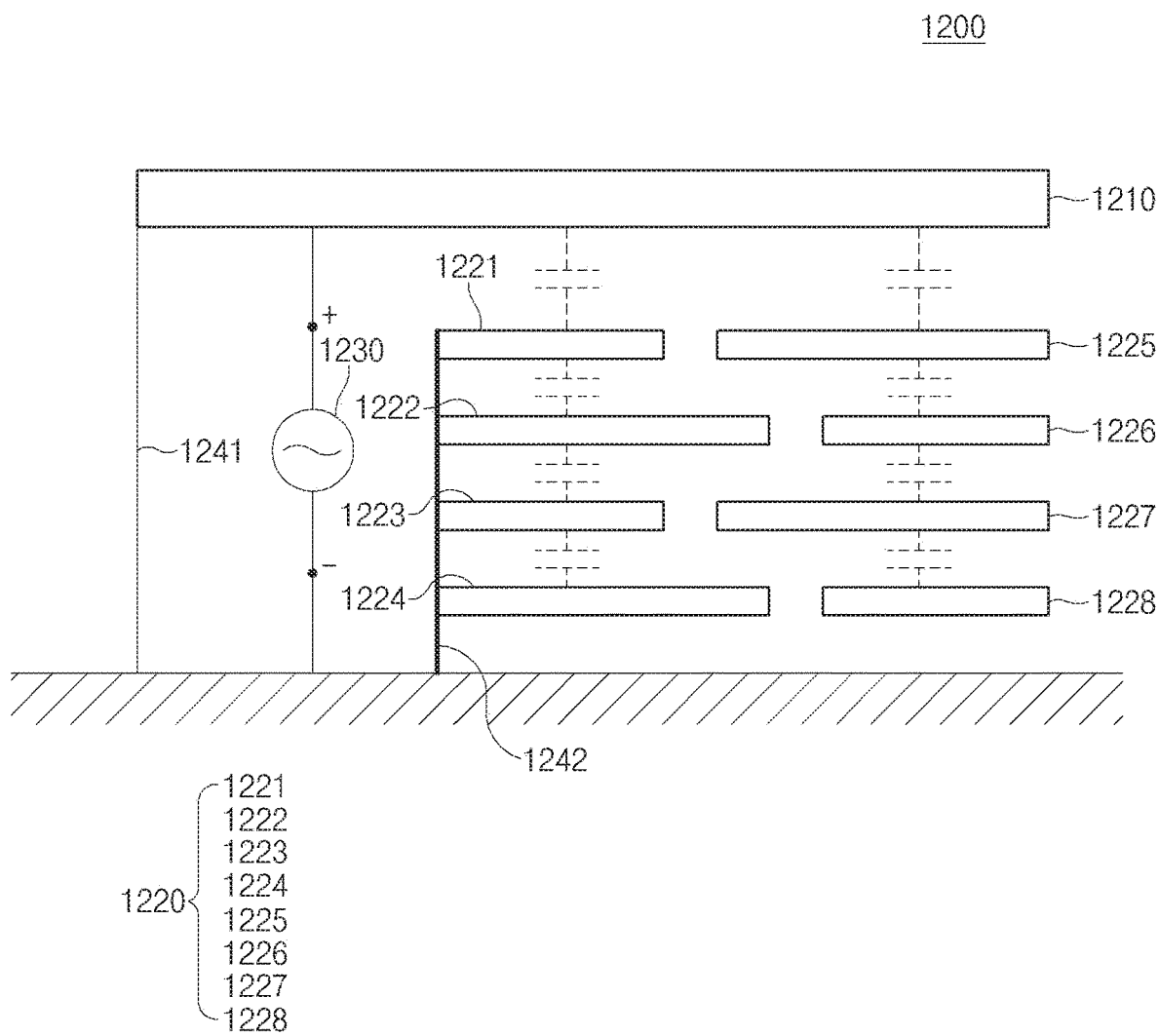
FIG. 12 schematically illustrates an antenna included in an electronic device according to an embodiment.

FIG. 12 schematically illustrates an antenna included in an electronic device according to an embodiment.

Referring to FIG. 12, an antenna included in an electronic device 1200 according to an embodiment may include an antenna radiator 1210, a plurality of metal members 1220, a feeder 1230, a first ground part 1241, and a second ground part 1242.

For example, the antenna radiator 1210 may be a component that is the same as or similar to the upper end portion 1130 of the housing 1101 illustrated in FIG. 11. The antenna radiator 1210 may radiate an electrical signal transferred from the feeder 1230 to the outside. The antenna radiator 1210 may receive an electrical signal from the outside.

According to an embodiment, the plurality of metal members 1220 may include eight metal members 1221, 1222, 1223, 1224, 1225, 1226, 1227, and 1228. For example, the first metal member 1221, the second metal member 1222, the third metal member 1223, the fourth metal member 1224, the fifth metal member 1225, the sixth metal member 1226, the seventh metal member 1227, and the eighth metal member 1228 may be components that are the same as or similar to the first extension 1171, the second extension 1172, the third extension 1173, the fourth extension 1174, the fifth extension 1175, the sixth extension 1176, the seventh extension 1177, and the eighth extension 1178 illustrated in FIG. 11, respectively.

According to an embodiment, the first slit 1161 illustrated in FIG. 11 may be formed between the antenna radiator 1210 and the first metal member 1221 and between the antenna radiator 1210 and the fifth metal member 1225. The antenna radiator 1210 and the first metal member 1221 may be spaced from each other by the first slit 1161. The second slit 1162 illustrated in FIG. 11 may be formed between the first metal member 1221 and the second metal member 1222 and between the fifth metal member 1225 and the sixth metal member 1226. The third slit 1163 illustrated in FIG. 11 may be formed between the second metal member 1222 and the third metal member 1223 and between the sixth metal member 1226 and the seventh metal member 1227. The fourth slit 1164 illustrated in FIG. 11 may be formed between the third metal member 1223 and the fourth metal member 1224 and between the seventh metal member 1227 and the eighth metal member 1228.

According to an embodiment, the antenna radiator 1210 may be electrically coupled with the first metal member 1221 and the fifth metal member 1225. The first metal member 1221 may be electrically coupled with the second metal member 1222. The second metal member 1222 may be electrically coupled with the third metal member 1223. The third metal member 1223 may be electrically coupled with the fourth metal member 1224. The fifth metal member 1225 may be electrically coupled with the sixth metal member 1226. The sixth metal member 1226 may be electrically coupled with the seventh metal member 1227. The seventh metal member 1227 may be electrically coupled with the eighth metal member 1228. When the antenna radiator 1210 is coupled with the first metal member 1221 and the fifth metal member 1225, a portion of a current that flows to the antenna radiator 1210 may be leaked out to the first metal member 1221 and the fifth metal member 1225.

According to an embodiment, the first gap 1181 illustrated in FIG. 11 may be formed between the first metal member 1221 and the fifth metal member 1225. The first metal member 1221 and the fifth metal member 1225 may be separated from each other by the first gap 1181. The second gap 1182 illustrated in FIG. 11 may be formed between the second metal member 1222 and the sixth metal member 1226. The third gap 1183 illustrated in FIG. 11 may be formed between the third metal member 1223 and the seventh metal member 1227. The fourth gap 1184 illustrated in FIG. 11 may be formed between the fourth metal member 1224 and the eighth metal member 1228. A capacitance between the antenna radiator 1210 and the first metal member 1221 and the fifth metal member 1225 may decrease by separating the first metal member 1221 and the fifth metal member 1225. For example, a current that is leaked out from the antenna radiator 1210 to the first metal member 1221 and the fifth metal member may decrease, and efficiency of an antenna may be improved.

The feeder 1230, the first ground part 1241, and the second ground part 1242 may be components that are the same as or similar to the feeder 730, the first ground part 741, and the second ground part 742 illustrated in FIG. 7, respectively.

An example is illustrated in FIG. 12 as the electronic device 1200 includes the plurality of metal members 1220, but the disclosure is not limited thereto. For example, the electronic device 1200 may include one metal member.

Figure 13:
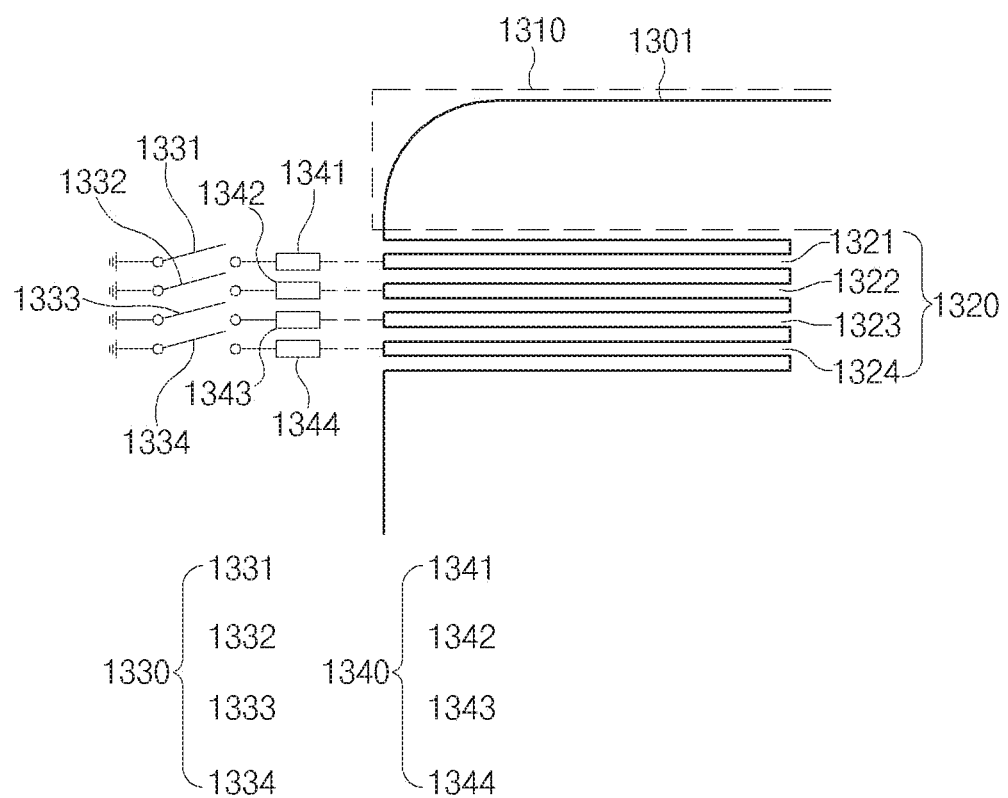
FIG. 13 illustrates a connection relationship between a housing and a switch included in an electronic device according to an embodiment.

FIG. 13 illustrates a connection relationship between a housing and a switch included in an electronic device according to an embodiment.

Referring to FIG. 13, an electronic device according to an embodiment may include a housing 1301, a plurality of switches 1330, and a plurality of lumped elements 1340. The housing 1301 may include an upper end portion 1310 and a plurality of extensions 1320. The housing 1301 may be a component that is similar to the housing 401 illustrated in FIG. 5A.

According to an embodiment, the plurality of switches 1330 may be electrically connected with the plurality of extensions 1320. For example, one ends of a first switch 1331, a second switch 1332, a third switch 1333, and a fourth switch 1334 may be electrically connected with a first extension 1321, a second extension 1322, a third extension 1323, and a fourth extension 1324, respectively. Each of opposite ends of the first switch 1331, the second switch 1332, the third switch 1333, and the fourth switch 1334 may be grounded.

According to an embodiment, the plurality of lumped elements 1340 may be electrically connected with the plurality of switches 1330. The plurality lumped elements 1340 may be interposed between the plurality of switches 1330 and the plurality of extensions 1320. For example, one ends of a first element 1341, a second element 1342, a third element 1343, and a fourth element 1344 may be electrically connected with the first switch 1331, the second switch 1332, the third switch 1333, and the fourth switch 1334, respectively. Opposite ends of the first element 1341, the second element 1342, the third element 1343, and the fourth element 1344 may be electrically connected with the first extension 1321, the second extension 1322, the third extension 1323, and the fourth extension 1324, respectively.

An example is illustrated in FIG. 13 as a lumped element and a switch are connected to each of the plurality of extensions 1320, but the disclosure is not limited thereto. For example, at least one lumped element and at least one switch may be connected to at least one extension 1320.

As example is illustrated in FIG. 13 as the plurality of lumped elements 1340 are connected to ends of the plurality of extensions 1320, but the disclosure is not limited thereto. For example, the plurality of lumped elements 1340 may be connected to different points of the plurality of extensions 1320.

An example is illustrated in FIG. 13 as the housing 1301 includes the plurality of extensions 1320, but the disclosure is not limited thereto. For example, the housing 1301 may include one metal member.

Figure 14:
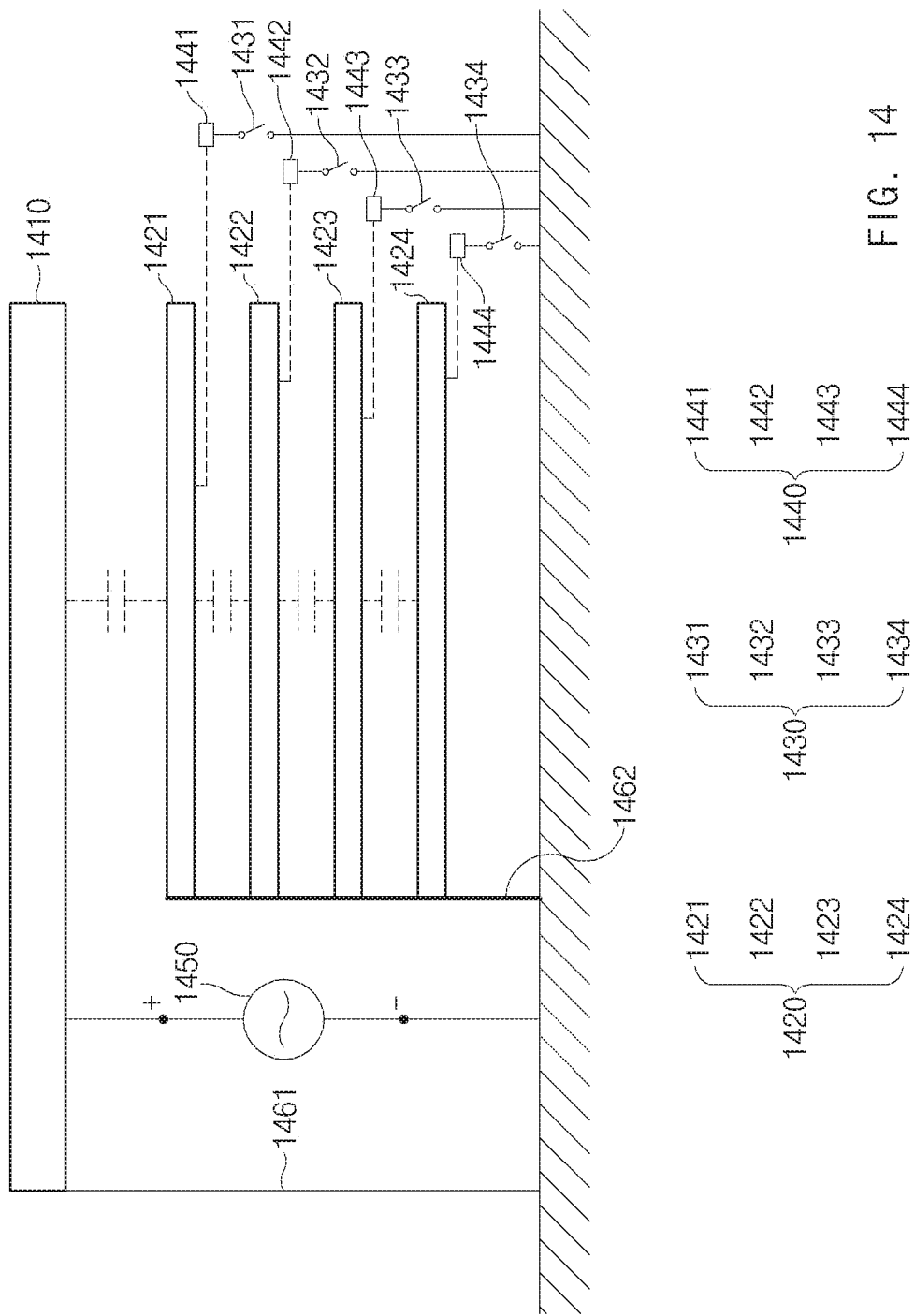
FIG. 14 schematically illustrates an antenna included in an electronic device according to an embodiment.

FIG. 14 schematically illustrates an antenna included in an electronic device according to an embodiment.

Referring to FIG. 14, an antenna included in an electronic device according to an embodiment may include an antenna radiator 1410, a plurality of metal members 1420, at least one switch 1430, at least one lumped element 1440, a feeder 1450, a first ground part 1461, and a second ground part 1462.

For example, the antenna radiator 1410 may be a component that is the same as or similar to the upper end portion 1310 of the housing 1301 illustrated in FIG. 13. The antenna radiator 1410 may radiate an electrical signal transferred from the feeder 1450 to the outside. The antenna radiator 1410 may receive an electrical signal from the outside.

According to an embodiment, the plurality of metal members 1420 may include a first metal member 1421, a second metal member 1422, a third metal member 1423, and a fourth metal member 1424. For example, the first metal member 1421, the second metal member 1422, the third metal member 1423, and the fourth metal member 1424 may be components that are the same as or similar to the first extension 1321, the second extension 1322, the third extension 1323, and the fourth extension 1324 illustrated in FIG. 13, respectively.

According to an embodiment, a slit may be formed between the first metal member 1421 and the second metal member 1422. The first metal member 1421 may be electrically coupled with the second metal member 1422. A slit may be formed between the second metal member 1422 and the third metal member 1423. The second metal member 1422 may be electrically coupled with the third metal member 1423. A slit may be formed between the third metal member 1423 and the fourth metal member 1424. The third metal member 1423 may be electrically coupled with the fourth metal member 1424.

According to an embodiment, the switch 1430 may include a first switch 1431, a second switch 1432, a third switch 1433, and a fourth switch 1434. For example, the switch 1430 may be a component that is the same as or similar to the switch 1330 illustrated in FIG. 13.

According to an embodiment, the lumped element 1440 may include a first element 1441, a second element 1442, a third element 1443, and a fourth element 1444. For example, the lumped element 1440 may be a component that is the same as or similar to the lumped element 1340 illustrated in FIG. 13.

According to an embodiment, when the first switch 1431 is turned on, the first metal member 1421 may be grounded through the first element 1441 and the first switch 1431. When the second switch 1432 is turned on, the second metal member 1422 may be grounded through the second element 1442 and the second switch 1432. When the third switch 1433 is turned on, the third metal member 1423 may be grounded through the third element 1443 and the third switch 1433. When the fourth switch 1434 is turned on, the fourth metal member 1424 may be grounded through the fourth element 1444 and the fourth switch 1434. The antenna radiator 1410 may be electrically coupled with the first metal member 1421. The first metal member 1421 may be electrically coupled with the second metal member 1422. The second metal member 1422 may be electrically coupled with the third metal member 1423. The third metal member 1423 may be electrically coupled with the fourth metal member 1424. For example, as the first switch 1431, the second switch 1432, the third switch 1433, and the fourth switch 1434 are turned on or turned off, a resonant frequency of the antenna radiator 1410 may be changed. Also, because the antenna radiator 1410 is not directly connected with the plurality of switches 1430, a loss due to the plurality of switches 1430 may decrease.

The feeder 1450 and the first ground part 1461 may be components that are the same as or similar to the feeder 730 and the first ground part 741 illustrated in FIG. 7, respectively.

According to an embodiment, an electronic device 1400 may include a processor (e.g., the processor 120 of FIG. 1 or the processor 210 of FIG. 2) that is electrically connected with the at least one switch 1430. The processor may control the plurality of switches 1430 independently such that the antenna radiator 1410 resonates at a frequency band targeted for the antenna radiator 1410. For example, the processor may control the plurality of switches 1430 such that at least some of the plurality of switches 1430 are turned on and the remaining switches are turned off.

An example is illustrated in FIG. 14 as the electronic device 1400 includes the plurality of metal members 1420, but the disclosure is not limited thereto. For example, the electronic device 1400 may include one metal member.

Figure 15:
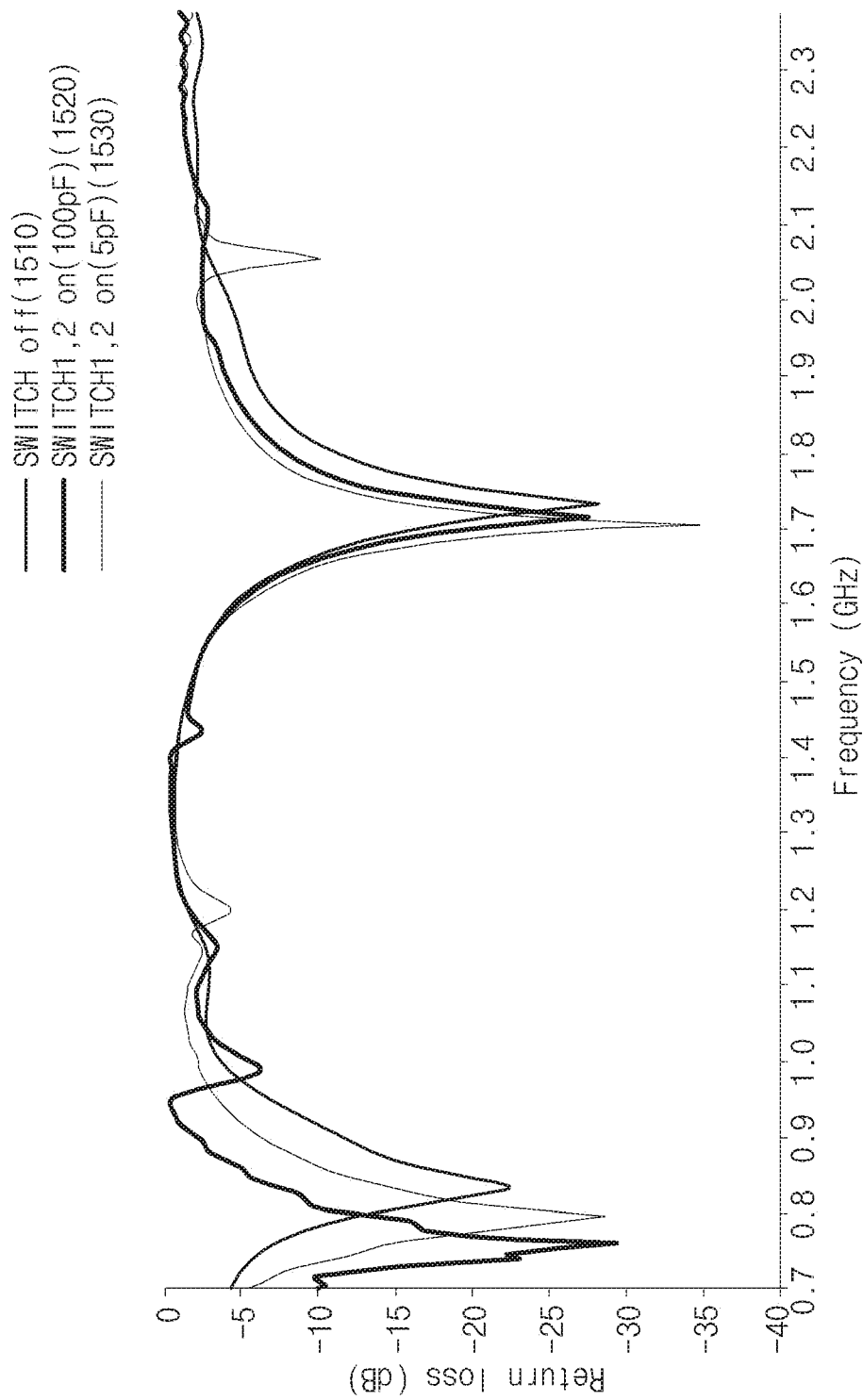
FIG. 15 is a graph illustrating a return loss of an antenna included in an electronic device for each frequency, according to an embodiment.

FIG. 15 is a graph illustrating a return loss of an antenna included in an electronic device for each frequency, according to an embodiment.

An electronic device according to an embodiment may be the electronic device 1400 illustrated in FIG. 14. Referring to FIG. 15, a first curve 1510 indicates a return loss of an antenna included in the electronic device 1400 for each frequency, when the plurality of switches 1430 are all turned off. A second curve 1520 indicates a return loss of the antenna included in the electronic device 1400 for each frequency, when the first switch 1431 and the second switch 1432 are turned off, the third switch 1433 and the fourth switch 1434 are turned on, and an impedance of the third element 1443 and the fourth element 1444 is 100 pF. A third curve 1530 indicates a return loss of the antenna included in the electronic device 1400 for each frequency, when the first switch 1431 and the second switch 1432 are turned off, the third switch 1433 and the fourth switch 1434 are turned on, and an impedance of the third element 1443 and the fourth element 1444 is 5 pF.

Referring to the first curve 1510, the antenna of the electronic device according to an embodiment may resonate at 800 MHz to 900 MHz. Referring to the second curve 1520, the antenna of the electronic device according to an embodiment may resonate at 700 MHz to 800 MHz. Referring to the third curve 1530, the antenna of the electronic device according to an embodiment may resonate at about 800 MHz. As illustrated in FIG. 14, a resonant frequency of the antenna of the electronic device may be variously adjusted according to an operation of a switch and an impedance of a lumped element.

Figure 16A:
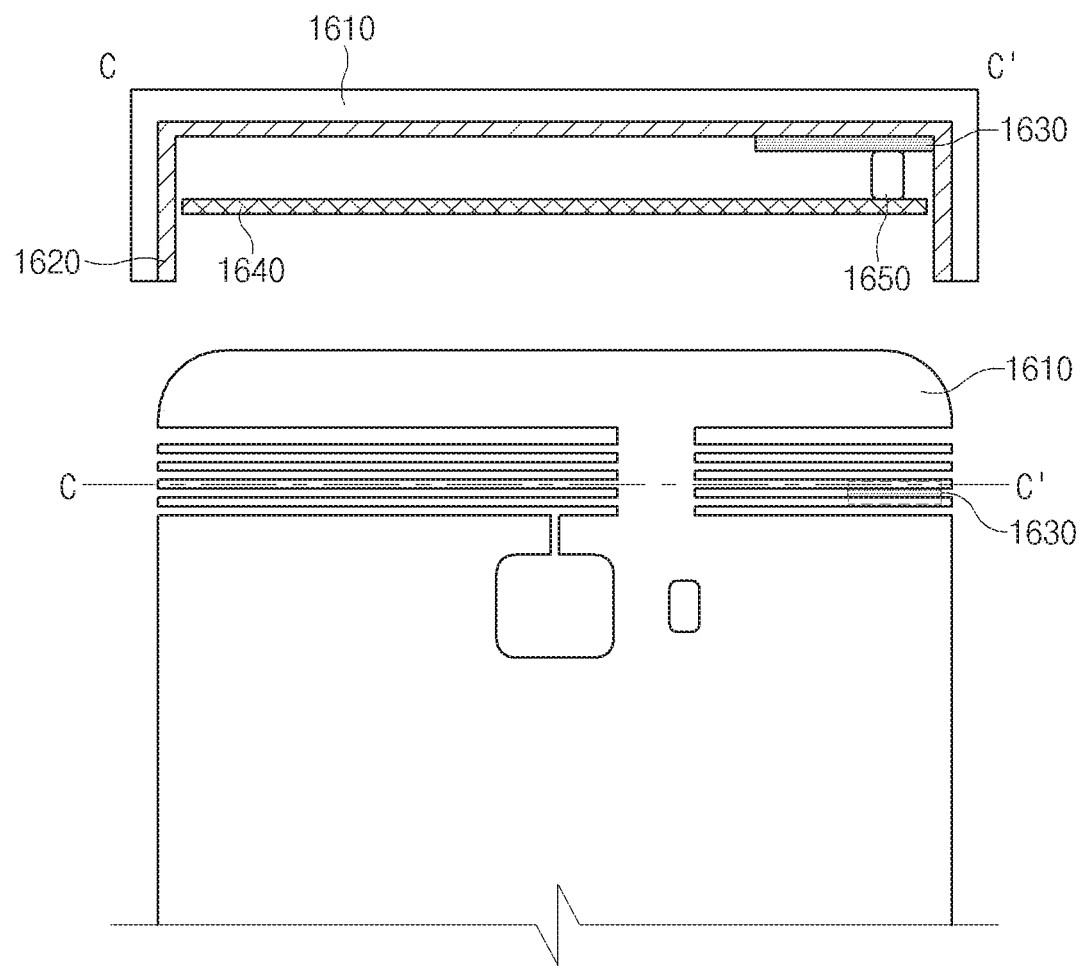
FIG. 16A schematically illustrates an internal structure of an electronic device according to an embodiment.

FIG. 16A schematically illustrates an internal structure of an electronic device according to an embodiment.

Referring to FIG. 16A, an electronic device 1610 according to an embodiment may include a housing 1610, a nonconductive support member 1620, a conductive member 1630, a printed circuit board 1640, and a connection part 1650.

A conductive portion of the housing 1610 may be exposed to the outside when combined with a body. For example, the housing 1610 may be the housing 401 illustrated in FIG. 5A. For example, the housing 1610 may include a plurality of extensions (e.g., the plurality of extensions 470 and 490 of FIG. 5A).

According to an embodiment, the nonconductive support member 1620 may be positioned under the housing 1610. The nonconductive support member 1620 may support the housing 1610. The nonconductive support member 1620 may be in contact with the body when combined with the body.

According to an embodiment, the conductive member 1630 may be attached to a lower surface of the nonconductive support member 1620. For example, the conductive member 1630 may be positioned to overlap at least a part of the plurality of extensions (e.g., the plurality of extensions 490) formed in the housing 1610. For example, the conductive member 1630 may be positioned to overlap two or more of the plurality of extensions (e.g., the plurality of extensions 490) formed in the housing 1610. For example, the conductive member 1630 may be electrically coupled with at least a part of the plurality of extensions.

According to an embodiment, the printed circuit board 1640 may be positioned under the housing 1610. The printed circuit board 1640 may include a feeder (e.g., the feeder 730 of FIG. 7) and a ground part (e.g., the first ground part 741 of FIG. 7).

According to an embodiment, the connection part 1650 may be electrically connected with the conductive member 1630 and the printed circuit board 1640. The conductive member 1630 may be electrically connected with the printed circuit board 1640 by a connection member 1650. The connection member 1650 may be, for example, a C-clip. The conductive member 1630 may be electrically connected with a ground part included in the printed circuit board 1640 through the connection member 1650 and may be grounded.

According to an embodiment, at least a part of the plurality of extensions 1320 may be easily grounded by using the conductive member 1630 electrically coupled with at least a part of the plurality of extensions (e.g., the plurality of extensions 470 and 490) of the housing 1610.

Figure 16B:
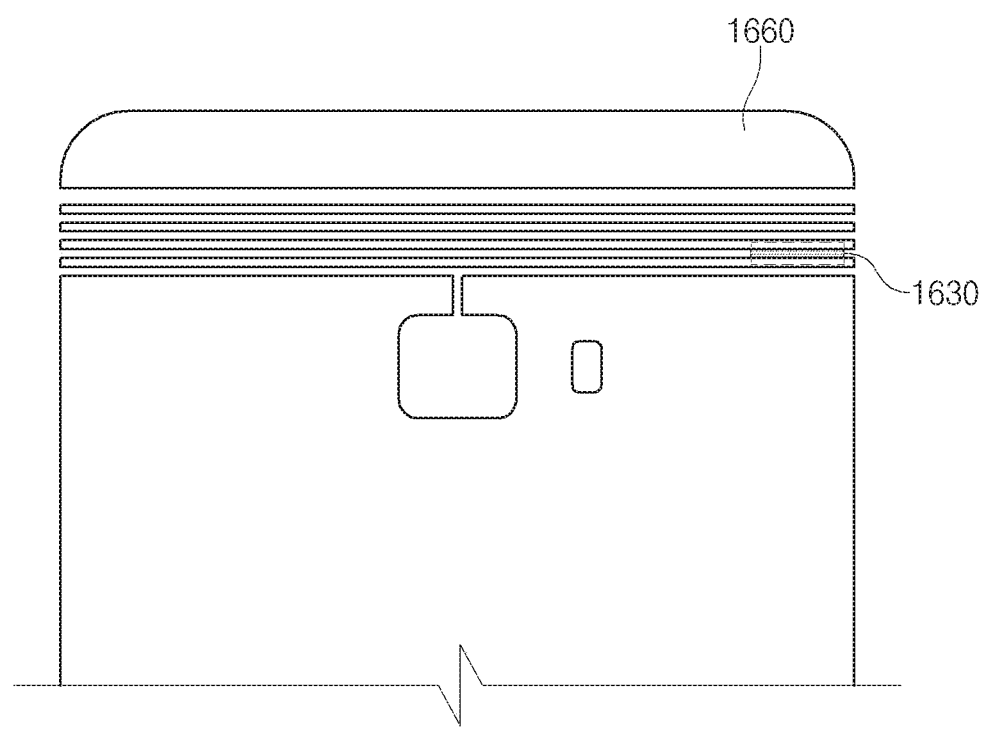
FIG. 16B schematically illustrates an internal structure of an electronic device according to an embodiment.

FIG. 16B schematically illustrates an internal structure of an electronic device according to an embodiment.

Referring to FIG. 16B, an electronic device according to an embodiment may include a housing 1660. The housing 1660 may be replaced with the housing 1610 illustrated in FIG. 16A. For example, the housing 1660 may be the housing 501 illustrated in FIG. 5A. For example, the housing 1660 may include a plurality of extensions (e.g., the plurality of extensions 570 of FIG. 5C).

According to an embodiment, the conductive member 1630 may be positioned to overlap at least a part of the plurality of extensions (e.g., the plurality of extensions 570) formed in the housing 1660. According to an embodiment, the conductive member 1630 may be positioned to overlap two or more of the plurality of extensions (e.g., the plurality of extensions 570) formed in the housing 1660. For example, the conductive member 1630 may be electrically coupled with at least a part of the plurality of extensions. A resonant frequency of an antenna may be changed according to the number of extensions overlapping the conductive member 1630 from among the plurality of extensions. A resonant frequency of an antenna may be changed according to the size of the conductive member 1630.

Figure 17:
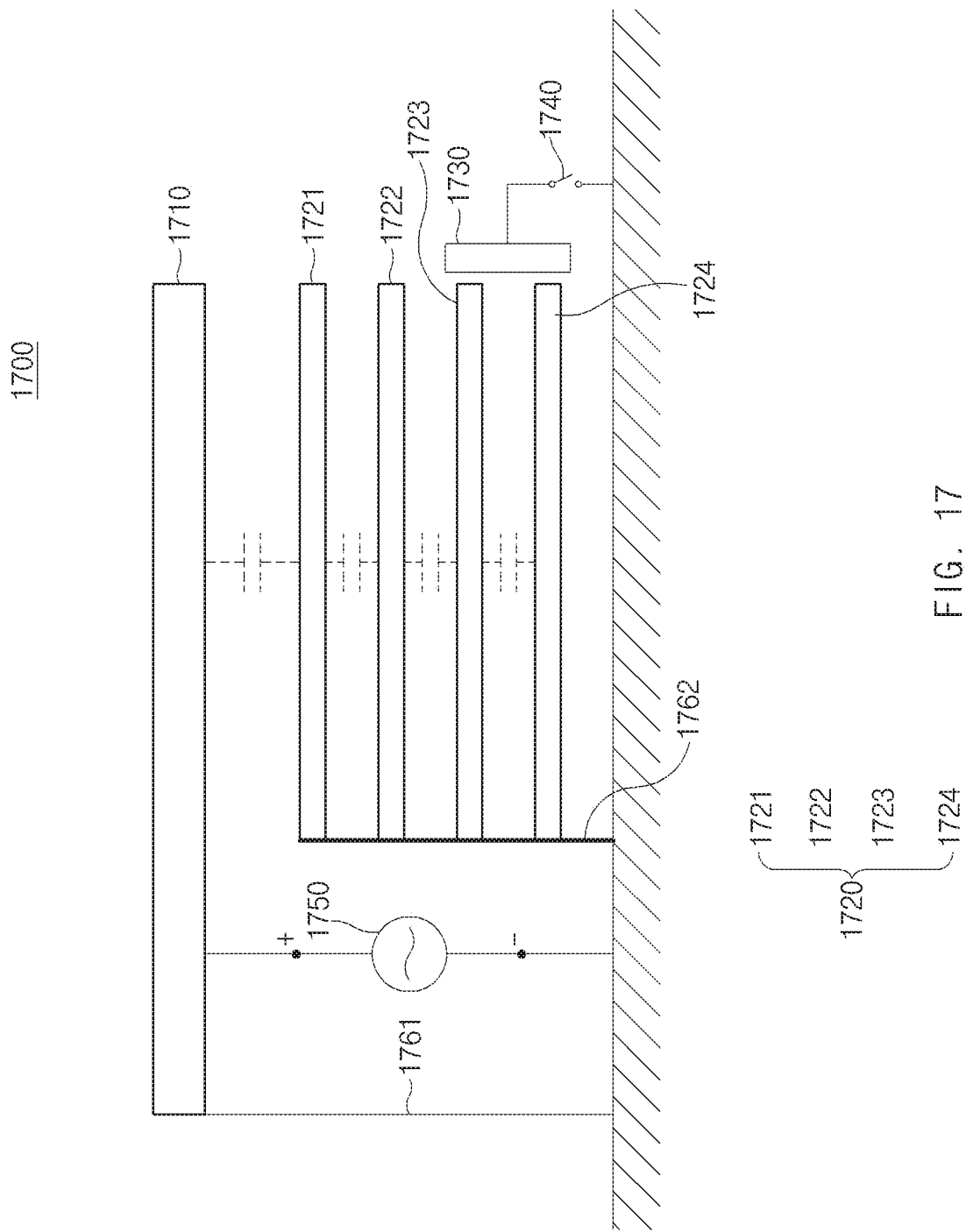
FIG. 17 schematically illustrates an antenna included in an electronic device according to an embodiment.

FIG. 17 schematically illustrates an antenna included in an electronic device according to an embodiment.

Referring to FIG. 17, an antenna included in an electronic device according to an embodiment may include an antenna radiator 1710, a plurality of metal members 1720, a conductive member 1730, a switch 1740, a feeder 1750, a first ground part 1761, and a second ground part 1762.

For example, the antenna radiator 1710 may be a component that is the same as or similar to the upper end portion 1310 of the housing 1301 illustrated in FIG. 13. The antenna radiator 1710 may radiate an electrical signal transferred from the feeder 1750 to the outside. The antenna radiator 1710 may receive an electrical signal from the outside.

According to an embodiment, the plurality of metal members 1720 may include a first metal member 1721, a second metal member 1722, a third metal member 1723, and a fourth metal member 1724. For example, the first metal member 1721, the second metal member 1722, the third metal member 1723, and the fourth metal member 1724 may be components that are the same as or similar to the first extension 1321, the second extension 1322, the third extension 1323, and the fourth extension 1324 illustrated in FIG. 13, respectively.

According to an embodiment, the conductive member 1730 may be electrically coupled with at least a part of the plurality of metal members 1720. For example, the conductive member 1730 may be electrically coupled with the third metal member 1723 and the fourth metal member 1724. The conductive member 1730 may be a component that is the same as or similar to the conductive member 1630 illustrated in FIG. 16A.

According to an embodiment, the switch 1740 may be electrically connected with the conductive member 1730. For example, one end of the switch 1740 may be electrically connected with the conductive member 1730, and an opposite end of the switch 1740 may be grounded. For example, the opposite end of the switch 1740 may be electrically connected with a ground part included in the printed circuit board 1640 of FIG. 16A. When the switch 1740 is turned on, the conductive member 1730 may be grounded. The antenna radiator 1710 may be electrically coupled with the first metal member 1721. The first metal member 1721 may be electrically coupled with the second metal member 1722. The second metal member 1722 may be electrically coupled with the third metal member 1723. The third metal member 1723 may be electrically coupled with the fourth metal member 1724. The third metal member 1723 and the fourth metal member 1724 may be electrically coupled with the conductive member 1730. Accordingly, as the switch 1740 is turned on or turned off, a resonant frequency of the antenna radiator 1710 may be changed. Because the antenna radiator 1710 is not directly connected with the switch 1740, a loss due to the switch 1740 may decrease.

According to an embodiment, the feeder 1750, the first ground part 1761, and the second ground part 1762 may be components that are the same as or similar to the feeder 730, the first ground part 741, and the second ground part 742 illustrated in FIG. 7, respectively.

According to an embodiment, an electronic device 1700 may include a processor (e.g., the processor 120 of FIG. 1 or the processor 210 of FIG. 2) that is electrically connected with the switch 1740. The processor may control the switch 1740 such that the antenna radiator 1710 resonates at a frequency band targeted for the antenna radiator 1710.

An example is illustrated in FIG. 17 as the electronic device 1700 includes the plurality of metal members 1720, but the disclosure is not limited thereto. For example, the electronic device 1700 may include one metal member.

Figure 18:
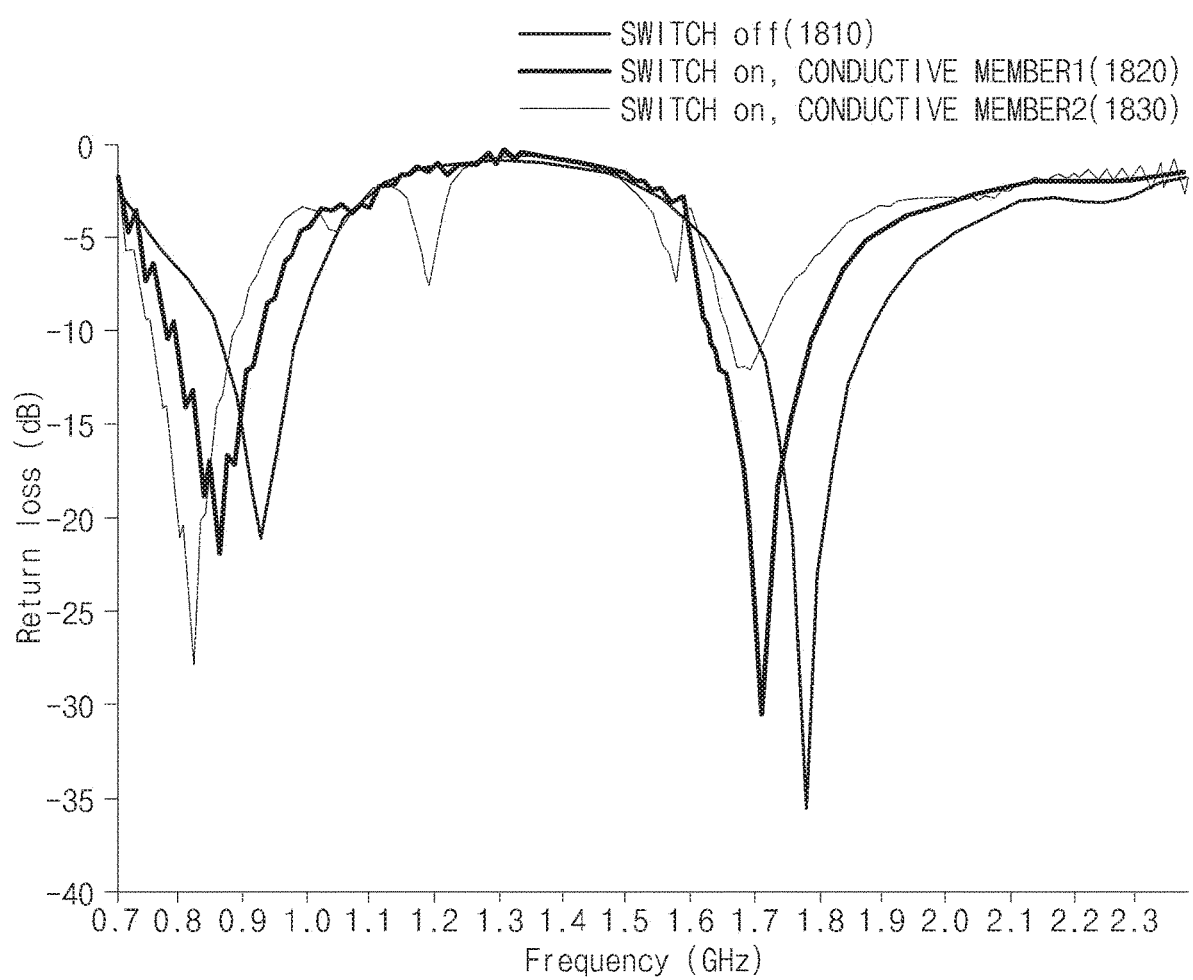
FIG. 18 is a graph illustrating a return loss of an antenna included in an electronic device for each frequency, according to an embodiment.

FIG. 18 is a graph illustrating a return loss of an antenna included in an electronic device for each frequency, according to an embodiment.

An electronic device according to an embodiment may be the electronic device 1700 illustrated in FIG. 17. Referring to FIG. 18, a first curve 1810 indicates a return loss of an antenna included in the electronic device 1700 for each frequency, when the switch 1700 is turned off. A second curve 1820 indicates a return loss of the antenna included in the electronic device 1700 for each frequency, when the switch 1700 that is electrically connected with the conductive member (or the first conductive member) 1730 electrically coupled with the third metal member 1723 and the fourth metal member 1724 is turned on. A third curve 1830 indicates a return loss of the antenna included in the electronic device 1700 for each frequency, when an electronic device includes a second conductive member electrically coupled with three metal members (e.g., the second metal member 1722, the third metal member 1723, and the fourth metal member 1724) and the switch 1700 electrically connected with the second conductive member is turned on.

Referring to the first curve 1810, the antenna of the electronic device according to an embodiment may resonate at about 900 MHz to about 1 GHz. Referring to the second curve 1820, the antenna of the electronic device according to an embodiment may resonate at a lower frequency than in the case of the first curve 1810. For example, the antenna of the electronic device according to an embodiment may resonate at about 800 MHz to about 900 MHz. Referring to the third curve 1830, the antenna of the electronic device according to an embodiment may resonate at a lower frequency than in the case of the second curve 1830. For example, the antenna of the electronic device according to an embodiment may resonate at about 800 MHz. As illustrated in FIG. 18, a resonant frequency of the antenna included in the electronic device may be variously adjusted according to an operation of a switch and the number of metal members coupled with a conductive member. For example, a resonant frequency of the antenna when the switch is turned on may be lower than a resonant frequency of the antenna when the switch is turned off. For another example, a resonant frequency of the antenna may become lower as the number of metal members coupled with a conductive member increases.

According to an embodiment, an electronic device may include a housing that covers at least a portion of a back surface of the electronic device, a plurality of slits being formed in parallel from one end to an opposite end and the at least a portion of the housing being formed of a conductive material, a feeder that is electrically connected with at least one point of the housing, and a ground part that is electrically connected with at least one point of the housing. A part of the plurality of slits may include a section greater in width than another part of the plurality of slits.

According to an embodiment, the housing may include an upper end portion that is positioned above the plurality of slits, a center portion that is positioned below the plurality of slits, a connection part that connects the upper end portion and the center portion, and a plurality of extensions that extend toward the one end from the connection part in a state where the plurality of extensions are interposed between the plurality of slits. The feeder may be electrically connected with at least one point of the upper end portion of the housing, and the ground part may be electrically connected with at least one point of the center portion of the housing.

According to an embodiment, the housing may cover at least a portion of the back surface of the electronic device and at least a portion of a side surface of the electronic device.

According to an embodiment, a width of the part of the plurality of slits may be greater than a width of the another part of the plurality of slits.

According to an embodiment, a width of a peripheral slit of the plurality of slits is greater than a width of another slit.

According to an embodiment, a width of a slit, which is adjacent to the upper end portion of the housing, from among the plurality of slits is greater than a width of another slit.

According to an embodiment, a width of each of the plurality of slits becomes greater as a distance from the upper end portion decreases.

According to an embodiment, a width of a partial section of the part of the plurality of slits is greater than a width of another section of the part of the plurality of slits.

According to an embodiment, a width of a partial section of the part of the plurality of slits may be greater than a width of another section of the part of the plurality of slits, and the width of the partial section may become greater as a distance from the upper end portion of the housing decreases.

According to an embodiment, a width of a partial section of the part of the plurality of slits may be greater than a width of another section of the part of the plurality of slits, and a length of the partial section may become greater as a distance from the upper end portion of the housing decreases.

According to an embodiment, a gap connecting one of the plurality of slits with another of the plurality of slits may be further defined in the housing.

According to an embodiment, the electronic device may further include one or more switches electrically connected with at least a part of the plurality of extensions respectively.

To solve the above-described problem, the electronic device according to an embodiment of the disclosure may further include one or more lumped elements electrically connected with one or more switches, respectively.

According to an embodiment, the electronic device may further include a processor that is electrically connected with one or more switches, and the processor may be configured to control one or more switches so as to resonate at a targeted frequency band.

According to an embodiment, the electronic device may further include a nonconductive member that supports the housing under the housing, and a conductive member that is attached to a lower surface of the nonconductive member, is positioned to overlap at least a part of the plurality of extensions, and is electrically connected with another ground part.

According to an embodiment, the conductive member may be positioned to overlap two or more of the plurality of extensions.

According to an embodiment, the electronic device may further include a switch that is electrically connected with the conductive member and another ground part.

According to an embodiment, the electronic device may further include a processor that is electrically connected with the switch, and the processor may be configured to control the switch so as to resonate at a targeted frequency band.

According to an embodiment, an electronic device may include a body and a housing that is combined with the body and covers at least a portion of a back surface of the body and at least a portion of a side surface of the body. The housing may include a metal member that is exposed to the outside when combined with the body, a plurality of slits being formed in parallel from one end to an opposite end, and a nonconductive member that supports the metal member and is in contact with the body. A width of a part of the plurality of slits may be greater than a width of another part of the plurality of slits.

According to an embodiment, an electronic device may include a housing that covers at least a portion of a back surface of the electronic device, a plurality of slits being formed in parallel from one end of the housing to an opposite end of the housing, and the housing including an upper end portion positioned above the plurality of slits, a center portion positioned below the plurality of slits, a connection part connecting the upper end portion and the center portion, and a plurality of extensions extending toward the one end from the connection part in a state where the plurality of extensions are interposed between the plurality of slits, and a printed circuit board that is positioned under the housing and includes a feeder electrically connected with at least one point of the upper end portion and a ground part electrically connected with at least one point of the center portion of the housing. A width of a part of the plurality of slits may be greater than a width of another part of the plurality of slits.

According to an embodiment, an electronic device may include a housing that includes a first plate, a second plate facing away from the first plate, and a side member surrounding a space between the first plate and the second plate, a display that is exposed through at least a portion of the first plate, a wireless communication circuit that is positioned within the housing, and a processor that is positioned within the housing and is electrically connected with the display and the communication circuit. The second plate may have a rectangular shape that includes a first side extending in a first direction and having a first length, a second side extending in a second direction perpendicular to the first direction and having a second length greater than the first length, a third side extending parallel to the first side and having the first length, and a fourth side extending parallel to the second side and having the second length. The second plate may have a metallic portion and a plurality of slits passing through the metallic portion and formed of a non-conductive member. The metallic portion may be electrically connected or coupled with the wireless communication circuit. The plurality of slits may include a first slit that extends in the first direction and has a first width, which is smaller than or the same as 0.50 mm, in the second direction, and a second slit that extends parallel to the first slit and has a second width smaller than the first width in the second direction.

According to an embodiment, the first width may be smaller than or the same as 0.15 mm, and the second width may be smaller than or the same as 0.10 mm.

According to an embodiment, the first slit may be closer to the first slit than the second slit.

According to an embodiment, the plurality of slits may further include a third slit that extends parallel to the first slit and has the second width in the second direction, and the second slit may be between the first slit and the third slit.

According to an embodiment, a distance between the first slit and the second slit in the second direction may be smaller than or the same as 0.60 mm.

According to an embodiment, an electronic device may include a housing that includes a first plate, a second plate facing away from the first plate, and a side member surrounding a space between the first plate and the second plate, a display that is exposed through at least a portion of the first plate, a wireless communication circuit that is positioned within the housing, a conductive structure that is interposed between the first plate and the second plate and is electrically connected with the wireless communication circuit, an electrical insulating layer that is interposed between the conductive structure and the second plate, and a processor that is positioned with the housing and is electrically connected with the display and the communication circuit. The second plate may have a metallic portion and a plurality of slits passing through the metallic portion and formed of a non-conductive member. The plurality of slits may extend parallel to each other and has a width smaller than or the same as 0.50 mm. The conductive structure may at least partially overlap the metallic portion and at least one of the plurality of slits, when viewed from above the second plate.

The term "module" used in this disclosure may include a unit composed of hardware, software and firmware and may be interchangeably used with the terms "unit", "logic", "logical block", "part" and "circuit". The "module" may be an integrated part or may be a minimum unit for performing one or more functions or a part thereof. The "module" may be implemented mechanically or electronically and may include at least one of an application-specific IC (ASIC) chip, a field-programmable gate array (FPGA), and a programmable-logic device for performing some operations, which are known or will be developed. At least a part of an apparatus (e.g., modules or functions thereof) or a method (e.g., operations) according to various embodiments may be, for example, implemented by instructions stored in computer-readable storage media (e.g., the memory 130) in the form of a program module. The instruction, when executed by a processor (e.g., the processor 120), may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and an internal memory. Also, the one or more instructions may contain a code made by a compiler or a code executable by an interpreter. A module or a program module according to various embodiments may include at least one of the above components, or a part of the above components may be omitted, or other components may be further included. Operations performed by a module, a program module, or other components according to various embodiments may be executed sequentially, in parallel, repeatedly, or in a heuristic method or some operations may be executed in different sequences or may be omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
a housing covering at least a portion of a back surface of the electronic device,
wherein the at least a portion of the housing is formed of a conductive material,
wherein a plurality of slits are formed in parallel from one end of the housing to an opposite end of the housing, and
wherein the housing includes an upper end portion being a portion above the plurality of slits and a center portion being a portion below the plurality of slits;
a feeder electrically connected with at least one point of the upper end portion of the housing; and
a ground part electrically connected with at least one point of the center portion of the housing,
wherein at least one slit, which is adjacent to the upper end portion of the housing, of the plurality of slits includes a section greater in width than a width of another slit of the plurality of slits.

2. The electronic device of claim 1, wherein the housing further includes a connection part connecting the upper end portion and the center portion, and a plurality of extensions extending toward the one end from the connection part in a state where the plurality of extensions are interposed between the plurality of slits.

3. The electronic device of claim 2, wherein the width of the section of the at least one slit is greater than a width of another section of the at least one slit, and
wherein the at least one slit is arranged such that a length of the section of each of the at least one slit becomes greater as a distance from the upper end portion of the housing decreases.

4. The electronic device of claim 2, further comprising:
one or more switches electrically connected with at least a part of the plurality of extensions, respectively.

5. The electronic device of claim 2, further comprising:
a nonconductive member supporting the housing disposed under the housing; and
a conductive member attached to a lower surface of the nonconductive member, positioned to overlap at least a part of the plurality of extensions, and electrically connected with another ground part.

6. The electronic device of claim 1, wherein the housing covers at least a portion of the back surface of the electronic device and at least a portion of a side surface of the electronic device.

7. The electronic device of claim 1, wherein a width of the at least one slit is greater than a width of remaining slits.

8. The electronic device of claim 1, wherein a width of a peripheral slit of the plurality of slits is greater than a width of another slit.

9. The electronic device of claim 1, wherein the plurality of slits are arranged in order of decreasing width from the upper end portion.

10. The electronic device of claim 1, wherein the width of the section of the at least one slit is greater than a width of another section of the at least one slit.

11. The electronic device of claim 1, wherein the width of the section of the at least one slit is greater than a width of another section of the at least one slit, and
wherein the at least one slit is arranged such that a width of the section of each of the at least one slit becomes greater as a distance from the upper end portion of the housing decreases.

12. The electronic device of claim 1, wherein a gap connecting one of the plurality of slits with another of the plurality of slits is further defined in the housing.

13. An electronic device comprising:
a body; and
a housing combined with the body and covering at least a portion of a back surface of the body and at least a portion of a side surface of the body,
wherein the housing includes a metal member exposed to the outside when combined with the body,
wherein a plurality of slits are formed in parallel from one end of the metal member to an opposite end of the metal member, and
wherein the housing includes an upper end portion being a portion above the plurality of slits and a center portion being a portion below the plurality of slits;
a nonconductive member supporting the metal member and being in contact with the body;
a feeder electrically connected with at least one point of the upper end portion of the housing; and
a ground part electrically connected with at least one point of the center portion of the housing,
wherein a width of at least one slit, which is adjacent to the upper end portion of the housing, of the plurality of slits is greater than a width of another slit of the plurality of slits.

14. An electronic device comprising:
a housing covering at least a portion of a back surface of the electronic device,
wherein a plurality of slits are formed in parallel from one end of the housing to an opposite end of the housing, and
wherein the housing includes an upper end portion being a portion above the plurality of slits, a center portion being a portion below the plurality of slits, a connection part connecting the upper end portion and the center portion, and a plurality of extensions extending toward the one end from the connection part in a state where the plurality of extensions are interposed between the plurality of slits; and
a printed circuit board positioned under the housing and including a feeder electrically connected with at least one point of the upper end portion and a ground part electrically connected with at least one point of the center portion of the housing,
wherein a width of at least one slit, which is adjacent to the upper end portion of the housing, of the plurality of slits is greater than a width of another slit of the plurality of slits.

* * * * *